United States Patent
Kang et al.

(10) Patent No.: US 7,417,910 B2
(45) Date of Patent: *Aug. 26, 2008

(54) LOW VOLTAGE SEMICONDUCTOR MEMORY DEVICE

(75) Inventors: Hee-Bok Kang, Ichon-shi (KR); Jin-Hong Ahn, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 39 days.

This patent is subject to a terminal disclaimer.

(21) Appl. No.: 11/133,420

(22) Filed: May 18, 2005

(65) Prior Publication Data

US 2006/0133132 A1 Jun. 22, 2006

(30) Foreign Application Priority Data

Dec. 22, 2004 (KR) .................. 10-2004-0110393

(51) Int. Cl.
*G11C 7/00* (2006.01)
*G11C 5/14* (2006.01)
*G11C 7/02* (2006.01)

(52) U.S. Cl. ............. 365/203; 365/189.09; 365/189.11; 365/207

(58) Field of Classification Search ............... 365/205, 365/207, 210, 189.09, 189.11, 203
See application file for complete search history.

(56) References Cited

U.S. PATENT DOCUMENTS

| | | | |
|---|---|---|---|
| 5,235,550 A | 8/1993 | Zagar | |
| 5,424,977 A * | 6/1995 | Rountree | 365/149 |
| 5,592,428 A | 1/1997 | Harrand et al. | |
| 6,078,538 A | 6/2000 | Ma et al. | |
| 6,570,799 B1 | 5/2003 | Parris | |
| 6,678,199 B1 | 1/2004 | Joo | |
| 6,950,353 B1 * | 9/2005 | Kim et al. | 365/200 |
| 7,126,867 B2 * | 10/2006 | Kang et al. | 365/203 |
| 2002/0054503 A1 * | 5/2002 | Lee | 365/149 |
| 2003/0151943 A1 * | 8/2003 | Sadakata | 365/149 |
| 2003/0202391 A1 * | 10/2003 | Nishimura et al. | 365/200 |
| 2004/0090814 A1 * | 5/2004 | Takahashi | 365/145 |
| 2005/0018470 A1 * | 1/2005 | Jung | 365/149 |
| 2005/0122765 A1 * | 6/2005 | Allen et al. | 365/145 |
| 2005/0128782 A1 * | 6/2005 | Jeon | 365/145 |
| 2006/0092738 A1 * | 5/2006 | Kang et al. | 365/210 |
| 2006/0133131 A1 * | 6/2006 | Kang et al. | 365/149 |
| 2006/0133132 A1 * | 6/2006 | Kang et al. | 365/149 |

FOREIGN PATENT DOCUMENTS

JP 2004-22073 1/2004
KR 2000-0027912 5/2000

* cited by examiner

*Primary Examiner*—Ly D Pham
(74) *Attorney, Agent, or Firm*—Blakely, Sokoloff, Taylor & Zafman LLP

(57) ABSTRACT

A semiconductor memory device having a cell array area for reading or storing data, including: a normal cell block including a plurality of normal cells, each being coupled to one of a bit line and a bit line bar for storing a data; a reference cell block including a plurality of reference cell units, each including a reference capacitor, a first reference metal oxide semiconductor (MOS) transistor for connecting the reference capacitor to the bit line, and a second reference MOS transistor for connecting the reference capacitor to the bit line bar; and a third reference MOS transistor coupled to the reference cell block for charging the reference capacitor with a reference voltage.

32 Claims, 27 Drawing Sheets

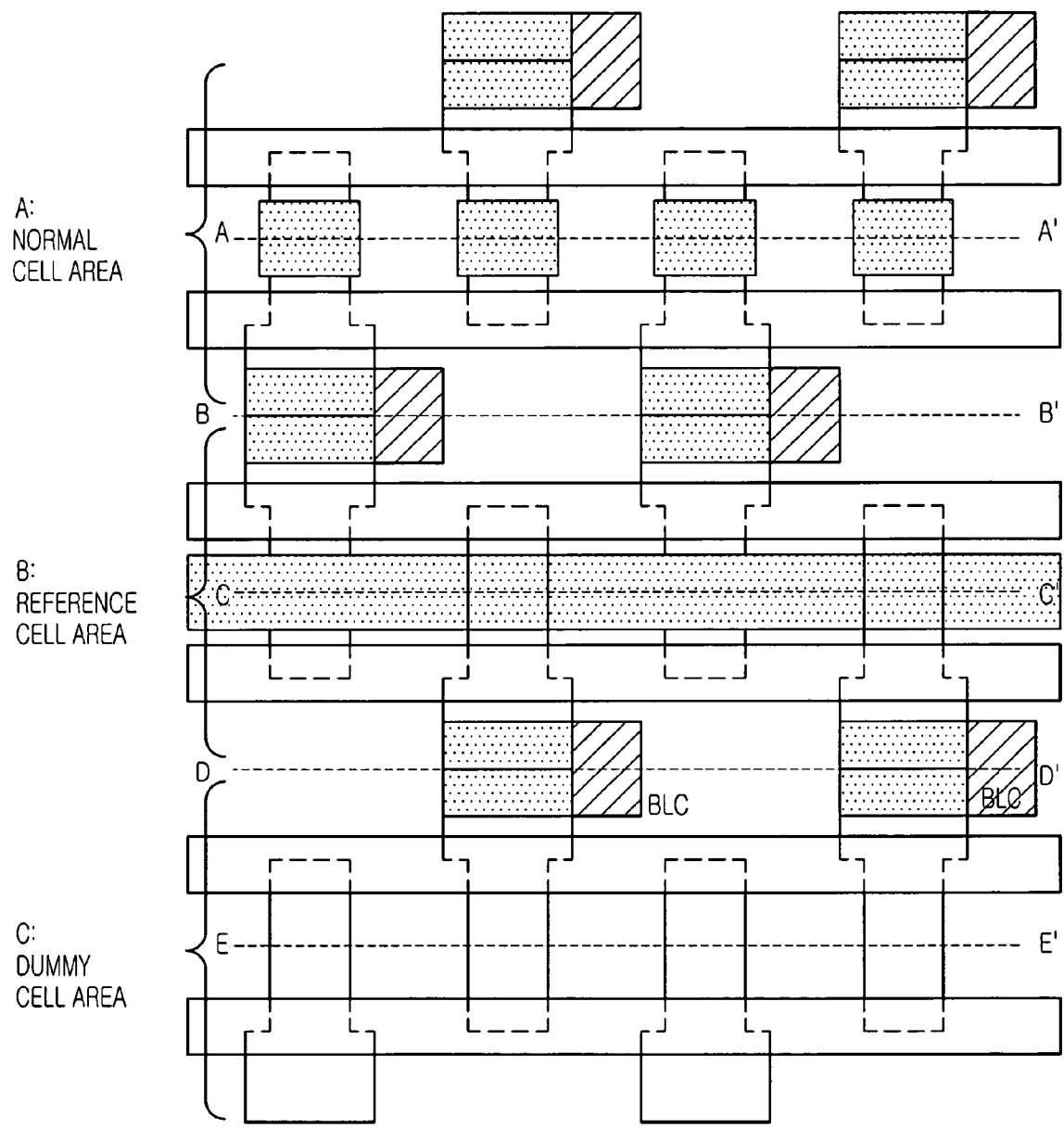

A: NORMAL CELL AREA

B: REFERENCE CELL AREA

C: DUMMY CELL AREA

A: NORMAL CELL AREA

B: REFERENCE CELL AREA

C: DUMMY CELL AREA

LOW VOLTAGE SEMICONDUCTOR MEMORY DEVICE

FIELD OF INVENTION

The present invention relates to a semiconductor memory device; and, more particularly, to a semiconductor memory device capable of efficiently operating at a low voltage.

DESCRIPTION OF PRIOR ART

FIG. 1 is a block diagram of a conventional semiconductor memory device.

Referring to FIG. 1, the conventional semiconductor memory includes a row address input unit 20 for decoding a row address, a column address input unit 30 for decoding a column address, a cell area 100 provided with a plurality of cell arrays 110, 120, 130 and 140 each having a plurality of unit cells, for outputting data corresponding to the output signals of the row address input unit 20 and the column address input unit 30, and a data input/output unit 40 for outputting the output data of the cell area 100 to an outside or transferring an external data to the cell area.

The cell area 100 includes sense amplifiers 150 and 160 for amplifying data signals from the cell arrays 110, 120, 130 and 140 and outputting the amplified data signals to the data input/output unit 40.

Also, each cell array 110, 120, 130 and 140 includes a plurality of unit cells.

During a read operation, the sense amplifiers 150 and 160 sense and amplify the data signals from the cell arrays 110, 120, 130 and 140 and output the amplified data signals to the data input/output unit 40. During a write operation, the sense amplifiers 150 and 160 latch the data from the data input/output unit 40 and transfer the latched data to the cell arrays 110, 120, 130 and 140.

FIG. 2 is a circuit diagram showing a cell array of a conventional semiconductor memory device.

Referring to FIG. 2, the cell array of the semiconductor memory device includes a plurality of unit cells disposed at intersections of word line WL0, WL1 . . . WL4 and WL5 and bit lines BL and /BL.

One unit cell CELL1 consists of a switching MOS transistor (e.g., M0) and a capacitor (e.g., C0) for storing data. The MOS transistor M0 has a gate connected to a word line WL0, one terminal connected to a bit line BL and the other terminal connected to the capacitor C0. The capacitor C0 has one terminal connected to the other terminal of the MOS transistor M0 and the other terminal receiving a plate voltage PL.

Two unit cells CELL1 and CELL2 connected to the adjacent word lines WL0 and WL1 are commonly connected to one bit line BL. The bit line BL and the bit line bar /BL are connected to the sense amplifier 152a of the sense amplifier part 150 disposed at one side of the cell array.

When data of the unit cell CELL1 is read, the word line WL0 is activated and thus the MOS transistor M0 of the unit cell CELL1 is turned on, so that data stored in the capacitor C0 is applied on the bit line BL.

The bit line sense amplifier 152a senses and amplifies a voltage difference between the bit line BL and the bit line bar /BL.

Then, the sensed and amplified data latched on the two bit line pair BL and BL/ are outputted external data lines LDB and LDBB.

At this point, the data signal is applied on the bit line BL and a complementary data is also applied on the bit line bar /BL. The complementary data is sensed and amplified and transferred to the outside. Like this, pair of data are transferred to the outside of the cell array.

If data "1" is stored in the capacitor C0 of the unit cell CELL1, that is, if the capacitor C0 is charged, a level of the bit line BL is amplified to a power supply voltage and a level of the bit line bar /BL is amplified to a ground voltage. Also, if data "0" is stored in the capacitor C0, that is, if the capacitor C0 is discharged, a level of the bit line BL is amplified to a ground voltage and a level of the bit line bar /BL is amplified to a power supply voltage.

Since electric charges stored for representing data of the unit cell is a very little, the capacitor of the unit cell becomes a discharged state after the electric charges are used to amplify the voltage of the bit line. Thus, a restore operation is needed to retain the data in the capacitor. The restore operation is an operation of transferring the electric charge to the capacitor of the unit cell using the data signal latched in the sense amplifier. When the restore operation is finished, the word line is deactivated.

When data of the unit cell CELL3 is read, the word line WL2 is activated and thus the MOS transistor M2 is turned on, so that data stored in the capacitor C2 is applied on the bit line bar /BL. The sense amplifier 152a senses and amplifies voltage difference between the bit line BL and the bit line bar /BL. Then, the data is outputted through the external data lines LDB and LDBB to the outside. At this point, the data signal is applied on the bit line bar /BL and a complementary data signal is applied on the bit line BL.

Like the data read operation, in a data write operation, a word line corresponding to a selected unit cell is activated and data is stored in the unit cell. Afterwards, the data is sensed and amplified by the bit line sense amplifier 152a and the previously latched data is replaced with the sensed and amplified data.

The data is latched by the bit line sense amplifier 152a and the latched data is stored in the capacitor of the unit cell. Then, the word line is deactivated.

FIG. 3 is a block diagram of a connection relationship between the sense amplifier and the cell array according to the prior art. In FIG. 3, a shared bit line sense amplifier structure is shown.

Referring to FIG. 3, sense amplifier parts 150 and 170 are provided among cell arrays 100, 130 and 180. Each of the sense amplifier parts 150 and 170 includes a plurality of sense amplifiers for sensing and amplifying data of unit cells contained in the cell arrays 100, 130 and 170.

The shared bit line sense amplifier structure shares one sense amplifier part per two cell arrays so as to reduce a circuit area. Therefore, one sense amplifier per bit line pair is required.

The shared bit line sense amplifier structure has one sense amplifier part 150 per two cell arrays 110 and 130 is provided, and the sense amplifier part and the cell arrays 110 and 130 are selectively connected in response to connection signals BISH and BISL.

For example, if the first connection signal BISH is activated, a first connection unit 151 is enabled to connect the sense amplifier part 150 and the cell array 0 110. Meanwhile, if the second connection signal BISL is activated, a second connection unit 153 is enabled to connect the sense amplifier part 150 and the cell array 1 130.

The sense amplifier part 150 further includes a precharge unit and a data output unit, in addition to the connection unit and the sense amplifier. The precharge unit and the data output unit will be described later in detail.

FIG. 4 is a circuit diagram showing an example of the sense amplifier part shown in FIG. 2.

Referring to FIG. 4, the sense amplifier part 150 operates in responsive to sense amplifier power supply signals SAP and SAN. The sense amplifier part 150 includes a sense amplifier 152a, a precharge unit 155a, a first equalization unit 154a, a second equalization unit 157a, and a data output unit 156a.

The sense amplifier 152a senses and amplifies signal difference between the bit line pair BL and /BL. The precharge unit 155a is enabled in response to a precharge signal BLEQ outputted when the sense amplifier 152a does not operate, and precharges the bit line pair BL and /BL to a bit line precharge voltage VBLP. In response to the precharge signal BLEQ, the first equalizer 154a equalizes voltage levels of the bit line pair BL and /BL connected between a cell array 0 110. In response to the bit line precharge signal BLEQ, the second equalizer 157a equalizes voltage levels of bit line pair BL and /BL connected to a cell array 1 130.

In response to a column control signal Y1 generated from a column address, the data output unit 156a outputs the data signal amplified by the sense amplifier 152a through data lines LDB and LDBB to the outside.

As described above, the sense amplifier part 150 includes the first and second connection units 151a and 153a for selectively connecting the sense amplifier 152a to the cell array 0 or the cell array 1.

FIG. 5 is a waveform showing an operation of the conventional semiconductor memory device.

An operation of the conventional semiconductor memory device will be described in detail with reference to FIGS. 1 to 4.

In the semiconductor memory device, a data read operation is divided into a precharge period, a read command period, a sense period, and a restore period.

Also, a data write operation is wholly the same as the data read operation. Instead of the read command period, a write command period is included. Instead of outputting data to an outside, data inputted from the outside is latched by the sense amplifier. Hereinafter, the data read operation will be described.

It is assumed that the capacitor is charged so that data "1" is stored. Also, it is assumed that the first connection unit 151a is enabled and the second connection unit 153a is disabled during the data read operation, so that the sense amplifier part 150 is connected to the cell array 0 110.

During the precharge period, a precharge voltage is applied on the bit line pair BL and /BL and all word lines are deactivated. ½ core voltage (Vcore/2=VBLP) is generally used as the precharge voltage.

During this period, the precharge signal BLEQ is activated to enable the first and second equalization units 154a and 157a and the precharge unit 155a, so that the bit line pair are maintained at ½ core voltage Vcore. At this point, the first and second connection units 151a and 153a are in the enabled state.

In FIG. 5, a waveform SN represents a voltage level applied on the capacitor of the unit cell. Since the waveform SN shows the case that the data "1" is stored, the voltage level represents the core voltage Vcore.

During the read command period where the read command is inputted and executed, the first connection unit 151a maintains the enabled state and the second connection unit 153a is set to the disabled state. Therefore, the bit line sense amplifier part 150 is connected to the cell array 0 110 provided at one side and is disconnected to the cell array 1 130 provided at the other side.

The word line WL is activated by a high voltage Vpp and maintained until the restore period. The high voltage Vpp higher than the power supply voltage is applied to the word line so as to reduce loss occurring while transferring the data "1" stored in the capacitor to the bit line as much as a threshold voltage of an NMOS transistor configuring the unit cell.

There is a demand for a semiconductor memory device having higher operation speed, while the power supply voltage is lowered. The word line WL can be activated at a high speed by using the high voltage Vpp higher than the core voltage Vcore supplied to the cell area of the semiconductor memory device.

When the word line WL is activated, a MOS transistor of a corresponding unit cell is turned on to apply the data stored in the capacitor to the bit line BL.

Accordingly, the voltage of the bit line BL precharged to the ½ core voltage increases. At this point, even though the capacitor is charged to the core voltage level, a capacitance Cc of the capacitor of the unit cell is very small compared with a parasitic capacitance Cb of the bit line BL. Thus, the voltage of the bit line does not increase up to the core voltage Vcore, but increases by a predetermined voltage ΔV from the ½ core voltage.

It can be seen from FIG. 5 that the voltage level applied to the capacitor of the unit cell and the voltage level applied to the bit line BL increase by a predetermined voltage ΔV from the ½ core voltage during the read command period.

Meanwhile, the bit line maintains the ½ core voltage because any additional charges are not applied thereto.

During the sense period, the first and second driving voltages SAP and SAN maintaining the ½ core voltage during the precharge period are respectively supplied to the core voltage and the ground voltage. Thus, the bit line sense amplifier 152a senses and amplifies a voltage difference between the two bit lines BL and /BL. At this point, the bit line sense amplifier 152a amplifies the relatively higher voltage level to the core voltage Vcore and the relatively lower voltage level to the ground voltage.

The bit line BL maintains the higher voltage level than the bit line bar /BL. Therefore, after the sensing and amplifying operation is finished, a voltage level of the bit line BL becomes the core voltage Vcore and a voltage level of the bit line bar /BL becomes the ground voltage.

Then, during the restore period, the charges stored in the capacitor of the unit cell and discharged so as to increase the voltage level of the bit line from the ½ core voltage are restored. After the restoring operation is finished, the word line is again deactivated.

Then, the precharge period again begins. The first and second driving voltages SAP and SAN supplied to the sense amplifier are maintained at the ½ core voltage. The precharge signal BLEQ is activated to enable the first and second equalization units 154a and 157a and the precharge unit 155a, so that the precharge voltage VBLP is supplied to the bit line pair BL and /BL. Due to the activation of the first and second connection units 151a and 153a, the sense amplifier part 150 is connected to the cell arrays 110 and 130 provided at the one side and the other side.

With the advance of the technology, the level of the power supply voltage used to drive the semiconductor memory device is lowered. However, even though the level of the power supply voltage is lowered, the semiconductor memory device is required to maintain or increase the operating speed.

The conventional semiconductor memory device appropriately uses the core voltage lower than the power supply voltage and the high voltage higher than the core voltage.

Till now, the required operating speed can be obtained only using a manufacturing technology of the semiconductor memory device, while properly reducing the power supply voltage.

For example, even though the power supply voltage decreases from 3.3 V to 2.5 V or less, the required operating speed can be satisfied through a process of gradually reducing from 500 nm to 100 nm in the manufacturing technology. That is, if the manufacturing technology is reduced, power consumption of the transistor is reduced; and if the same voltage is supplied, the semiconductor memory device can operate at higher speed.

However, it is difficult to reduce the manufacturing technology in 100 nm or less.

Also, the required power supply voltage is reduced to 2.0 V or 1.5V, and even 1.0 V. Under such a situation, it is difficult to maintain the required operating speed only by reducing the manufacturing technology.

In addition, if the power supply voltage supplied to the semiconductor memory device is lowered below a predetermined level, an operating margin of the MOS transistors configuring the semiconductor memory device becomes very small. Therefore, the semiconductor memory device cannot operate according to the required operating speed and cannot rely on the stable operation.

In such a situation that the turn-on voltage of the MOS transistor maintains a predetermined level, if the level of the driving voltage inputted to the semiconductor memory device is lowered below a predetermined level, it takes a long time for the sense amplifier to sense and amplify a voltage difference between two bit lines.

At this point, even though noise occurs slightly (that is, the bit line voltage level rises or falls due to a slight noise at the ½ core voltage), the sense amplifier may not operate correctly.

Accordingly, it is difficult to reduce the driving voltage for the semiconductor memory device below a predetermined level.

Also, if the manufacturing technology is reduced very much, a gap between a gate electrode of a MOS transistor in each unit cell and bit lines arranged adjacent to the gate electrode becomes very narrow, so that leakage current flows between the gate electrode and the bit lines. This leakage current is referred to as a bleed current.

FIG. 6 is a sectional view for explaining a problem of the conventional semiconductor memory device, in particular, a problem of a leakage current in a low-voltage high-integrated semiconductor memory device.

FIG. 6 is a sectional view showing a unit cell of a semiconductor memory device. Referring to FIG. 6, the unit cell includes a device isolation layer 11, source/drain junction regions 12a and 12b, a gate electrode 13, a bit line 17, capacitor 14 and 16, and insulating layers 18 and 19.

With the reduction in the manufacturing technology of the semiconductor memory device, a gap A between the gate electrode 13 and the bit line 17 is gradually narrower. Thus, a sufficient insulation is difficult.

In such a state, the ½ core voltage is applied to the bit line and the ground voltage is applied to the gate electrode acting as the word line during the precharge period.

Due to errors in the manufacturing processes, the bit line and the gate electrode acting as the word line may be shorted. In this case, a bleed current continuously flows from the bit line to the word line.

After manufacturing the semiconductor memory, a repair process is performed to replace a defective cell with a dummy cell. At this point, the repair process is performed according to word lines, not replacing the defective cell with a unit cell.

When the semiconductor memory device operates, a word line corresponding to the defective unit cell is not used and the dummy word line is used.

When the defect is caused by the short between the word line and the bit line, the bleed current continuously flows from the bit line precharged to the ½ core voltage to the word line, even though there is no problem in the operation because the word line of the defective cell is replaced with the dummy cell.

With the advance of the technology, the low voltage operation becomes very important. Accordingly, if the bleed current occurs, the semiconductor memory device cannot be used, even though there is no problem in its operation.

In order to reduce the bleed current, there has been proposed a method of adding a resistor on a path where the bleed current flows. However, this method contributes to the reduction of the bleed current but cannot solve the fundamental problem.

SUMMARY OF INVENTION

It is, therefore, an object of the present invention to provide a semiconductor memory device capable of operating at a high speed even at a low voltage and preventing an occurrence of a bleed current, thereby reducing a wasteful power consumption. In particular, there is provided a layout of the semiconductor memory device.

In accordance with an aspect of the present invention, there is provided a semiconductor memory device having a cell array area for reading or storing data, including: a normal cell block including a plurality of normal cells, each being coupled to one of a bit line and a bit line bar for storing a data; a reference cell block including a plurality of reference cell units, each including a reference capacitor, a first reference metal oxide semiconductor (MOS) transistor for connecting the reference capacitor to the bit line, and a second reference MOS transistor for connecting the reference capacitor to the bit line bar; and a third reference MOS transistor coupled to the reference cell block for charging the reference capacitor with a reference voltage.

In accordance with another aspect of the present invention, there is provided a semiconductor memory device having a plurality of bit line pairs with a folded bit line architecture, the semiconductor memory device including: a plurality of normal cells including a normal capacitor and a normal MOS transistor for connecting the normal capacitor to one of a bit line and a bit line bar; a plurality of reference cells including a reference capacitor, a first reference MOS transistor for connecting a corresponding bit line to a first node of the reference capacitor, and a second reference MOS transistor for connecting the first node of the reference capacitor to the bit line bar adjacent to the bit line; a reference voltage supply unit for supplying a reference voltage to a second node of the reference capacitor provided at each of the reference cells; at least two precharge MOS transistors for supplying the reference voltage to the first node of the reference capacitor provided at each of the reference cell during a precharge period; and a metal shunt line for maintaining a drain of each of the precharge MOS transistor at the same voltage level.

BRIEF DESCRIPTION OF THE DRAWINGS

The above and other objects and features of the present invention will become apparent from the following description of preferred embodiments taken in conjunction with the accompanying drawings, in which:

FIGS. 12A to 19A are layouts of the semiconductor memory device in accordance with the present invention; and FIGS. 12B to 19B are sectional views of the semiconductor memory device shown in FIGS. 12A to 19A.

DETAILED DESCRIPTION OF INVENTION

Hereinafter, a semiconductor memory device having a column address path therein in accordance with the present invention will be described in detail referring to the accompanying drawings.

Figure 1:
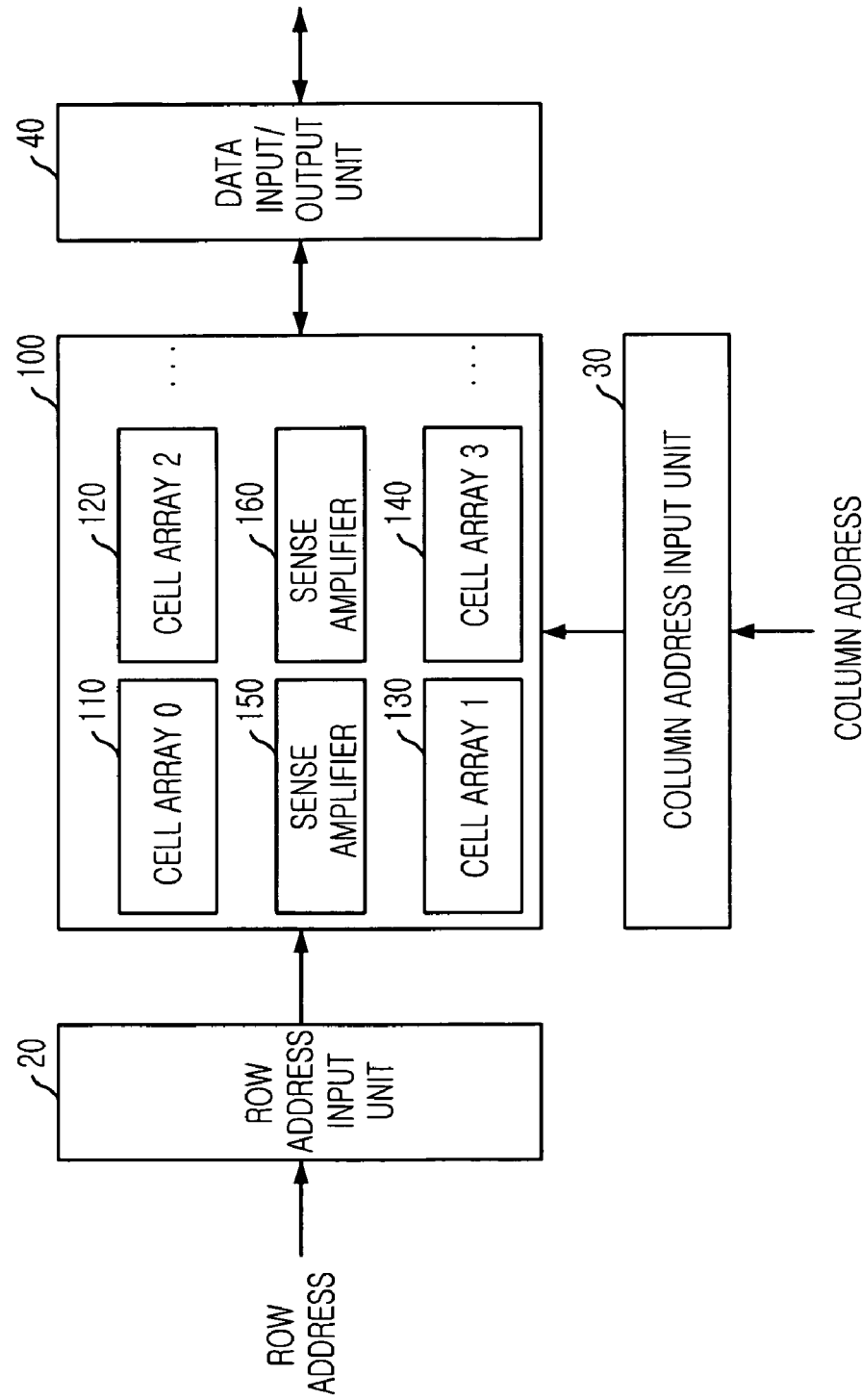
FIG. 1 is a block diagram of a conventional semiconductor memory device.
Figure 2:
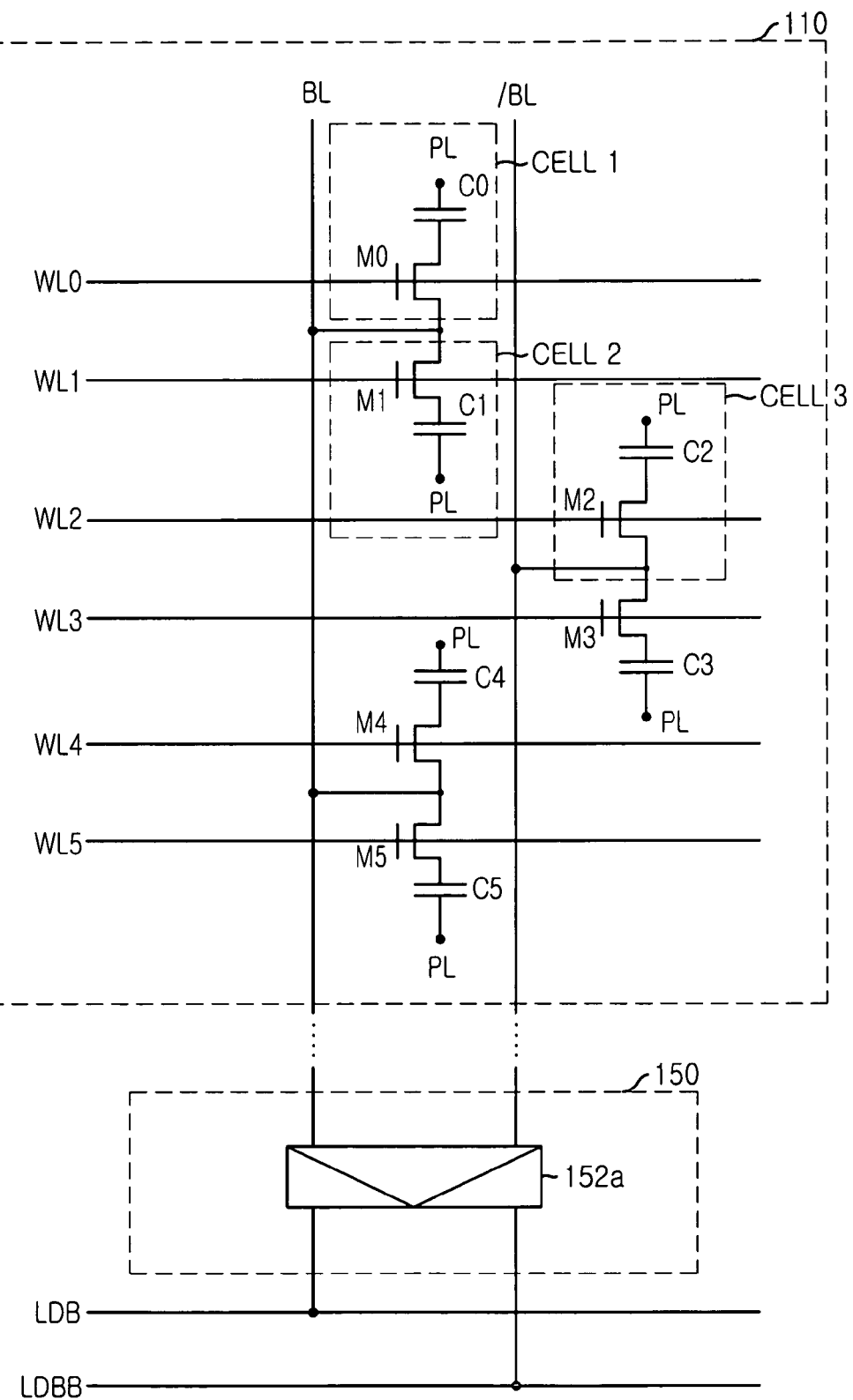
FIG. 2 is a circuit diagram showing a cell array of a conventional semiconductor memory device.
Figure 3:
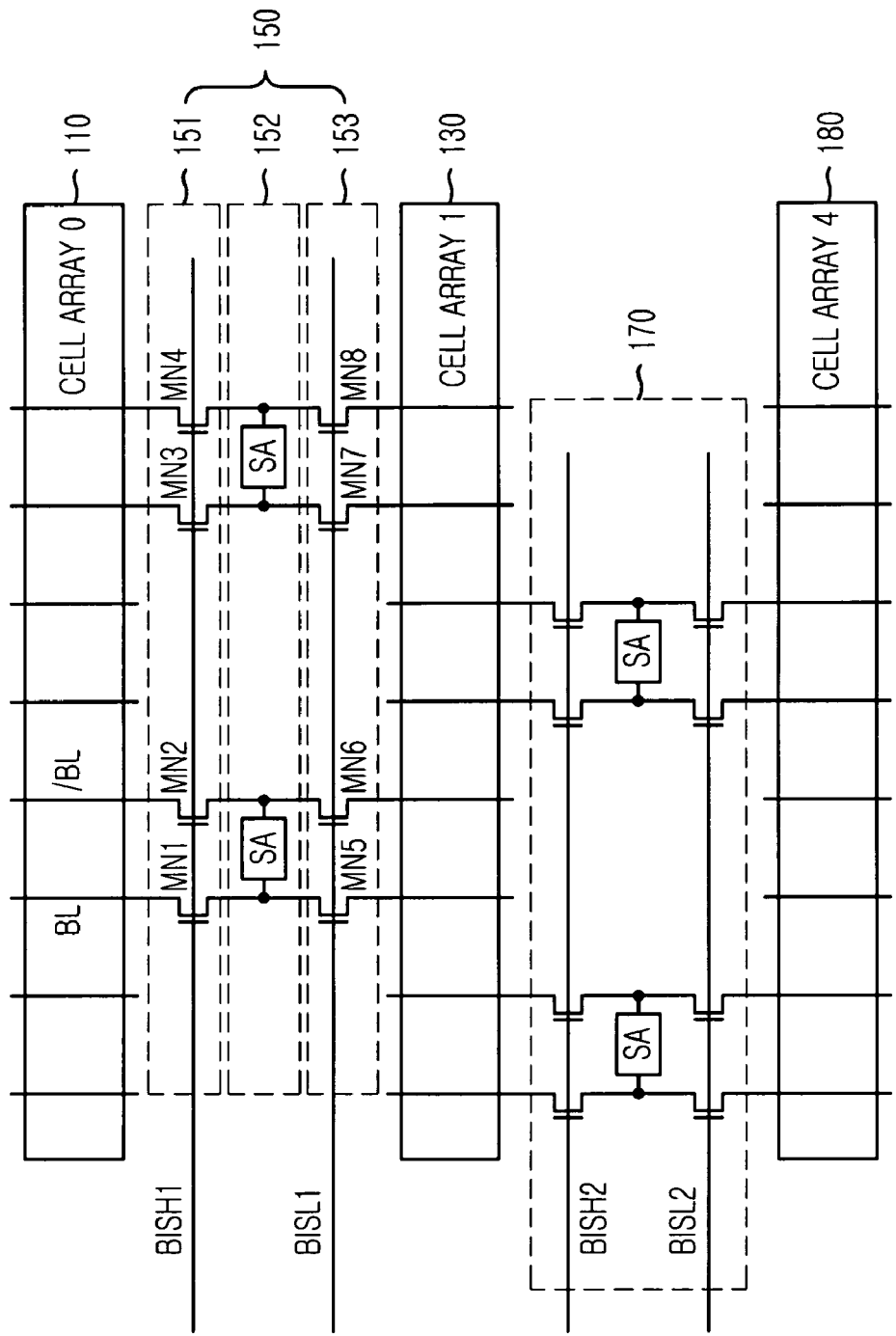
FIG. 3 is a block diagram of a connection relationship between a sense amplifier and a cell array, particularly a shared bit line sense amplifier structure, according to the prior art.
Figure 4:
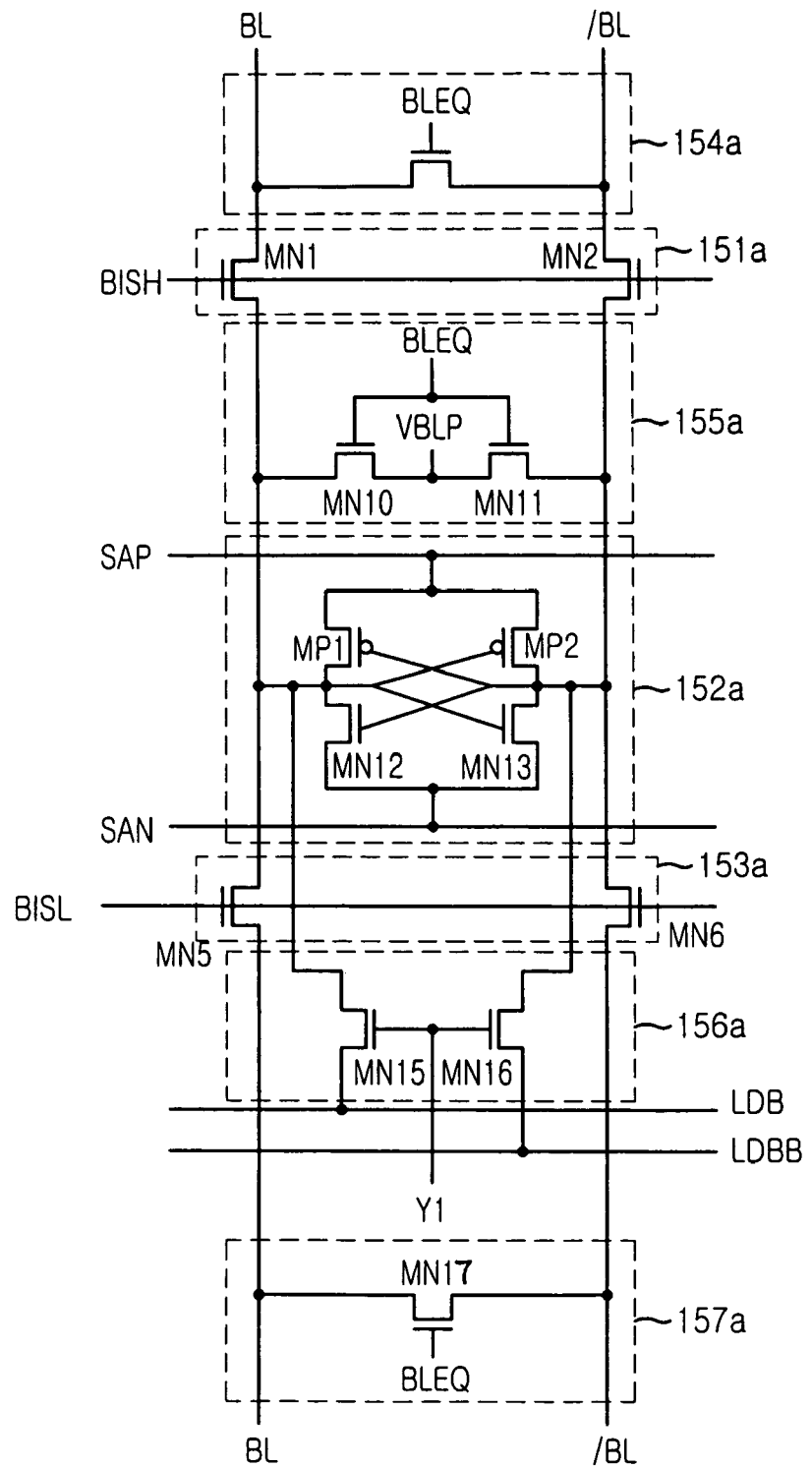
FIG. 4 is a circuit diagram showing an example of the sense amplifier part shown in FIG. 2.
Figure 5:
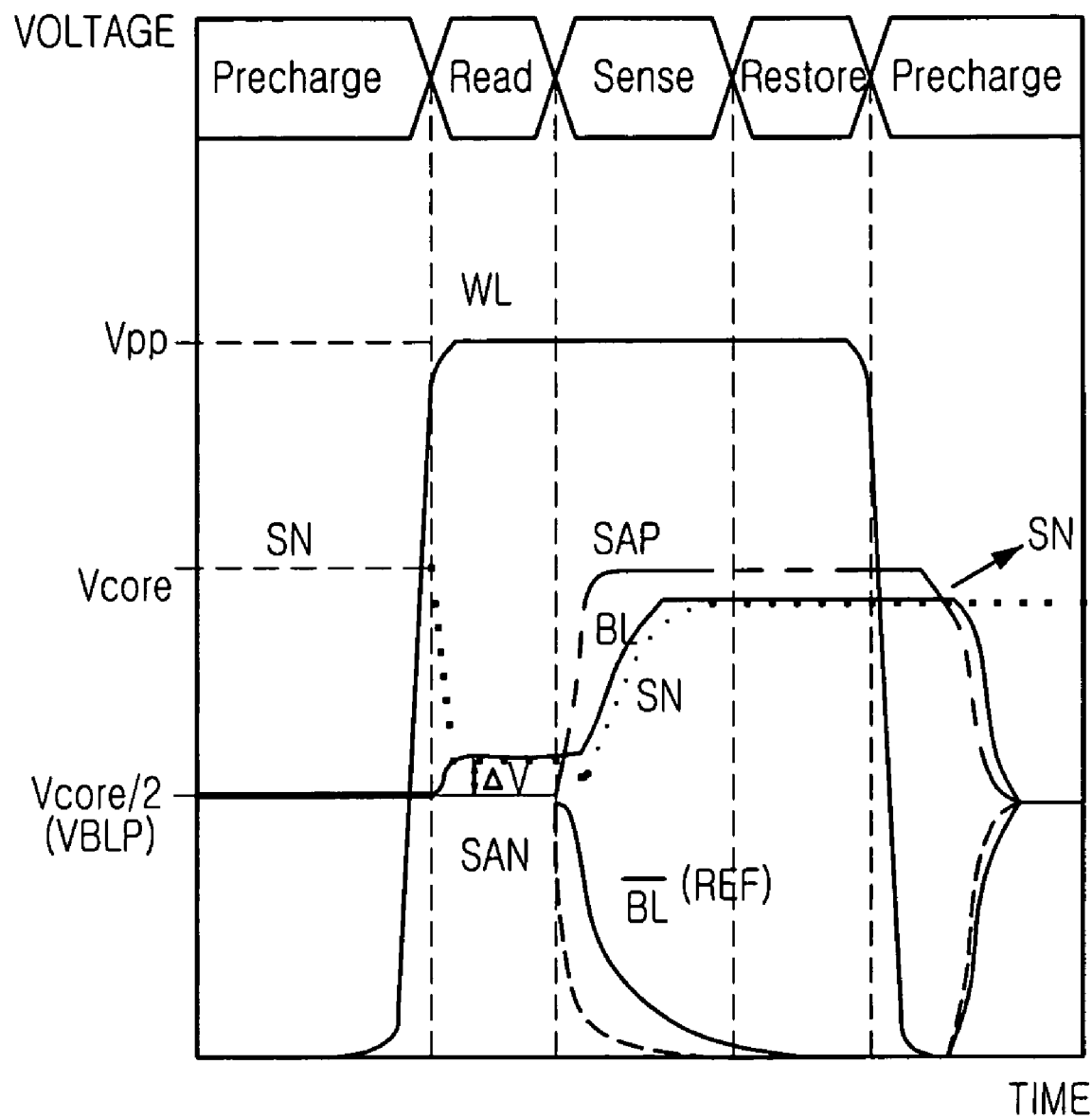
FIG. 5 is a waveform showing an operation of the conventional semiconductor memory device.
Figure 6:
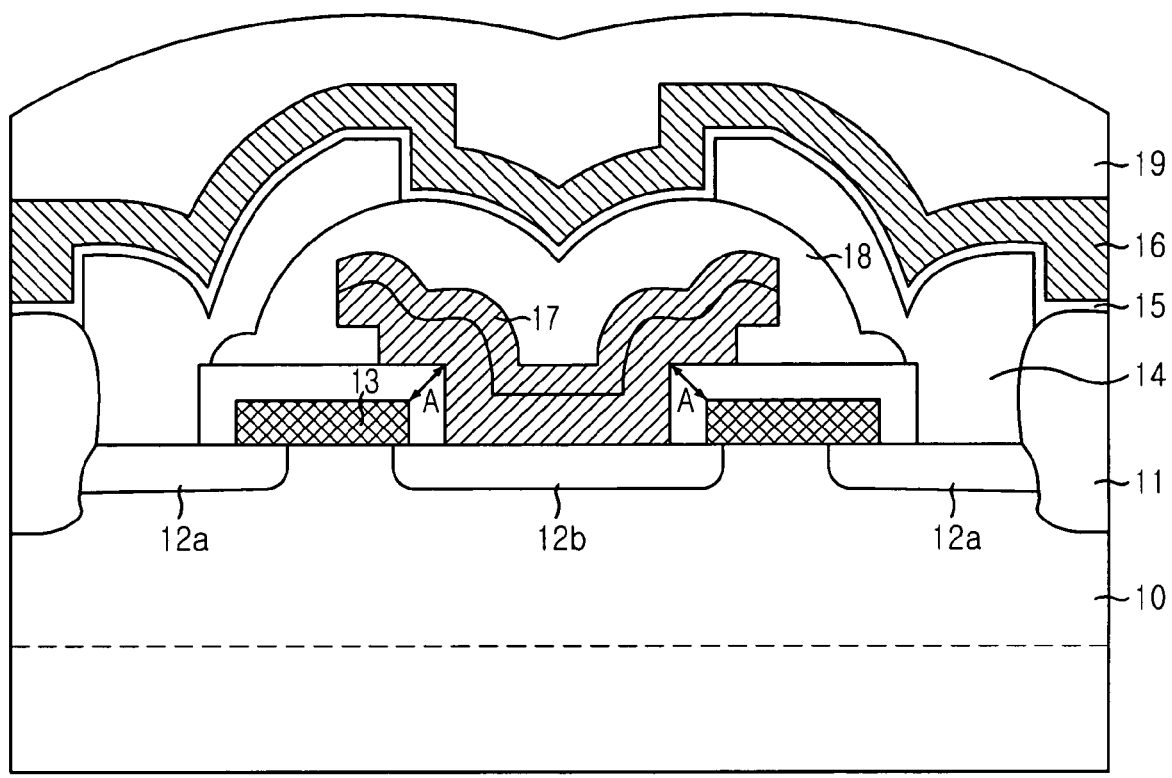
FIG. 6 is a sectional view for explaining a problem of the conventional semiconductor memory device.
Figure 7:
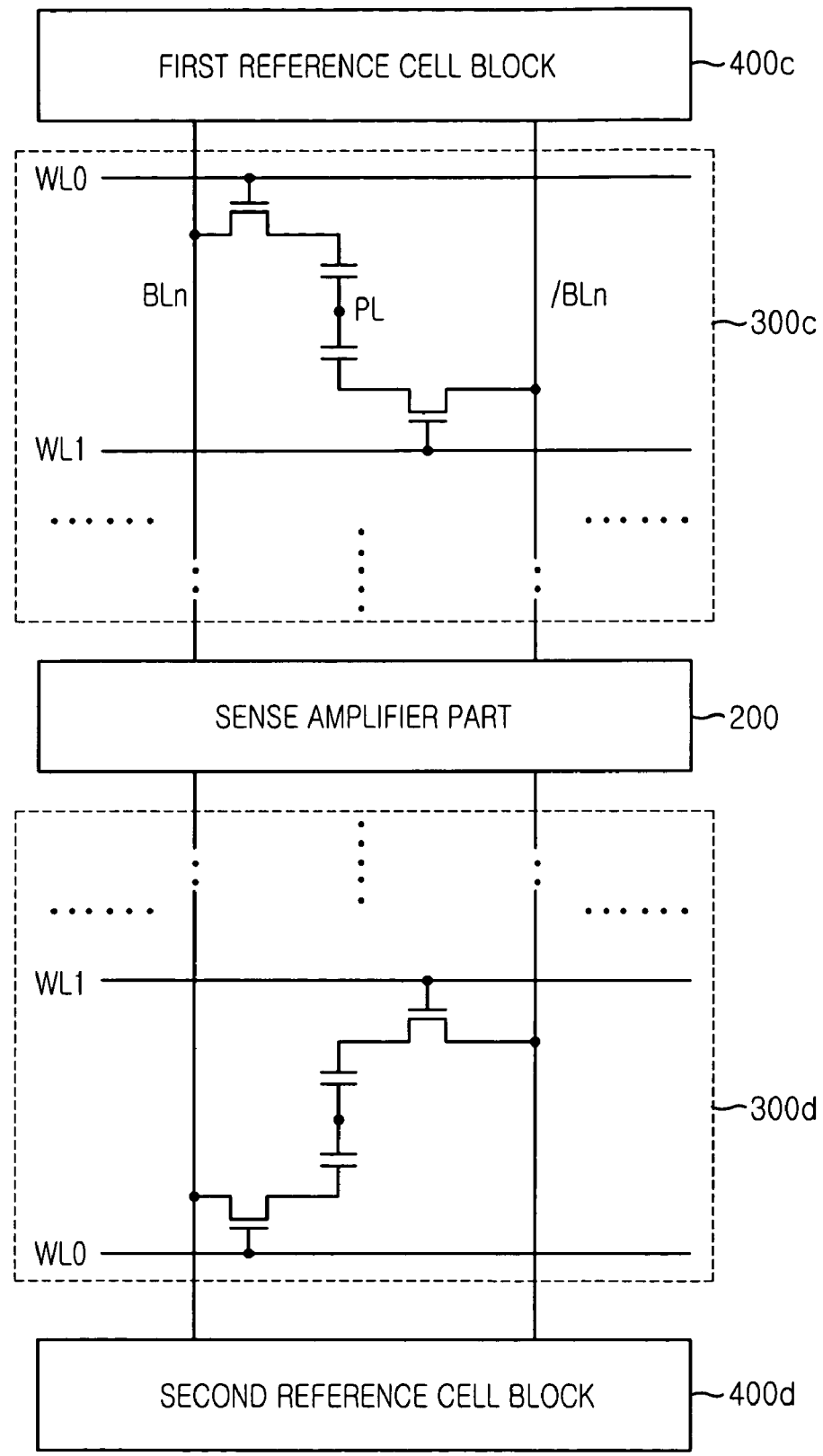
FIG. 7 is a block diagram of a semiconductor memory device in accordance with an embodiment of the present invention.

FIG. 7 is a block diagram of a semiconductor memory device in accordance with an embodiment of the present invention.

Referring to FIG. 7, the semiconductor memory device in accordance with an embodiment of the present invention includes has a folded bit line architecture. Cell arrays 300c and 300d include bit line BL and bit line bar /BL arranged alternately. A plate voltage PL is commonly applied to capacitors constituting two unit cells.

Figure 8:
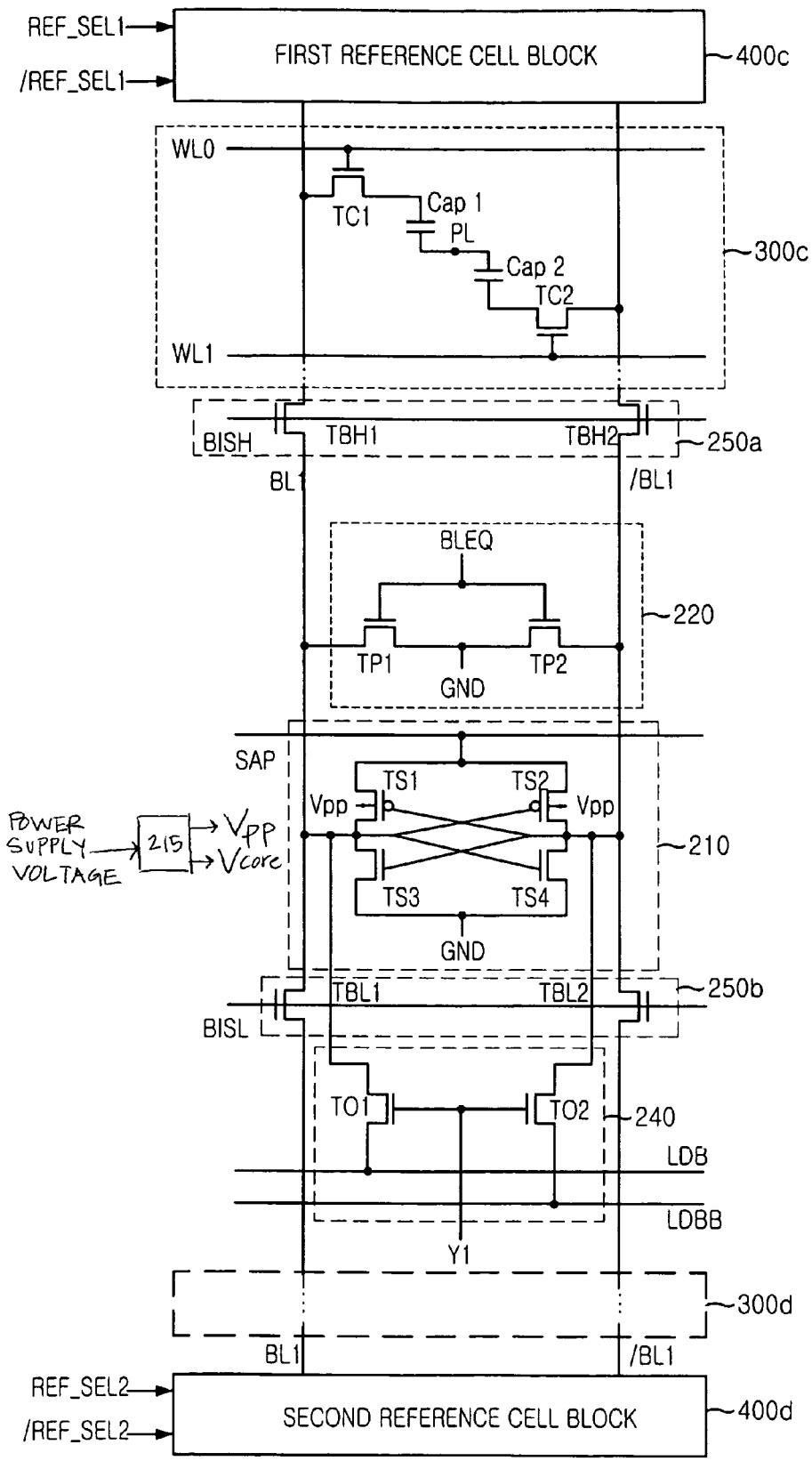
FIG. 8 is a detailed circuit diagram of the semiconductor memory device, particularly the sense amplifier part shown in FIG. 7, in accordance with an embodiment of the present invention.

FIG. 8 is a detailed circuit diagram of the semiconductor memory device, especially the sense amplifier part, in accordance with an embodiment of the present invention.

Referring to FIG. 8, the semiconductor memory device includes a first cell array 300c, a bit line sense amplifier 210, a precharge unit 220, a first reference cell block 400c, a second reference block 400d, and an internal voltage generator 215. The first cell array 300c applies data signal on a bit line BL1 or a bit line bar /BL1.

Also, the bit line sense amplifier 210 is driven with a high voltage Vpp higher than a core voltage Vcore inputted as a driving voltage during a predetermined initial period in which the voltage difference between the bit line and the bit line bar is sensed and amplified. Further, the internal voltage generator 215 receives a power supply voltage inputted to the semiconductor memory device to generate the core voltage Vcore and the high voltage Vpp.

In addition, the semiconductor memory device in accordance with the present invention includes a first connection unit 250a for connecting or disconnecting the sense amplifier 210 to or from the bit line and the bit line bar coupled to the cell array 300c, a second cell array 300d for applying data signal to the bit line and the bit line bar, and a second connection unit 250b for connecting or disconnecting the sense amplifier 210 to or from the bit line and the bit line bar. The bit line sense amplifier 210 is connected to the bit line and the bit line bar connected to the first cell array 300c or the bit line and the bit line bar connected to the second cell array 300d. The sense amplifier 210 senses and amplifies the signal applied on the bit line and the bit line bar connected thereto.

Also, the precharge unit 220 includes a first precharge MOS transistor TP1 and a second precharge MOS transistor TP2. The first precharge MOS transistor TP1 receives the precharge signal BLEQ through a gate and supplies a ground voltage GND inputted from one terminal to the bit line BL1 as the precharge voltage through the other terminal. The second precharge MOS transistor TP2 receives the precharge voltage through a gate and supplies the ground voltage GND inputted from one terminal to the bit line bar /BL1 as the precharge voltage through the other terminal.

The bit line sense amplifier 210 includes a first PMOS transistor TS1, a second PMOS transistor TS2, a first NMOS transistor TS3, and a second NMOS transistor TS4. The first PMOS transistor TS1 has a gate commonly connected to the bit line and the bit line bar, one terminal receiving the high voltage Vpp or the core voltage Vcore as the driving voltage, and the other terminal connected to the bit line BL and the bit line bar /BL. The second PMOS transistor TS2 has a gate commonly connected to the bit line BL1 and the bit line bar /BL1, one terminal receiving a high voltage Vpp or a core voltage Vcore as a driving voltage, and the other terminal connected to the bit line BL1 and the bit line bar /BL1. The first NMOS transistor TS3 has a gate commonly connected to the bit line BL1 and the bit line bar /BL1, one terminal receiving a ground voltage GND, and the other terminal connected to the bit line BL and the bit line bar /BL1. The second NMOS transistor TS4 has a gate commonly connected to the bit line BL1 and the bit line bar /BL1, one terminal receiving the ground voltage GND, and the other terminal connected to the bit line BL1 and the bit-line bar /BL1.

Also, the semiconductor memory device further includes a data input/output unit 240 for transferring the data sensed and amplified by the bit line sense amplifier 210 to the outside, or transferring the data inputted from the outside through data lines LDB and LDBB to the bit line sense amplifier 210.

The data input/output unit 240 includes a first I/O MOS transistor TO1 and a second I/O MOS transistor TO2. The first I/O MOS transistor TO1 has a gate receiving an I/O control signal Y1, one terminal connected to the bit line BL1, and the other terminal connected to the first data line LDB. The second I/O MOS transistor TO2 has a gate receiving the I/O control signal Y1, one terminal connected to the bit line bar /BL1, and the other terminal connected to the second data line LDBB.

Figure 9:
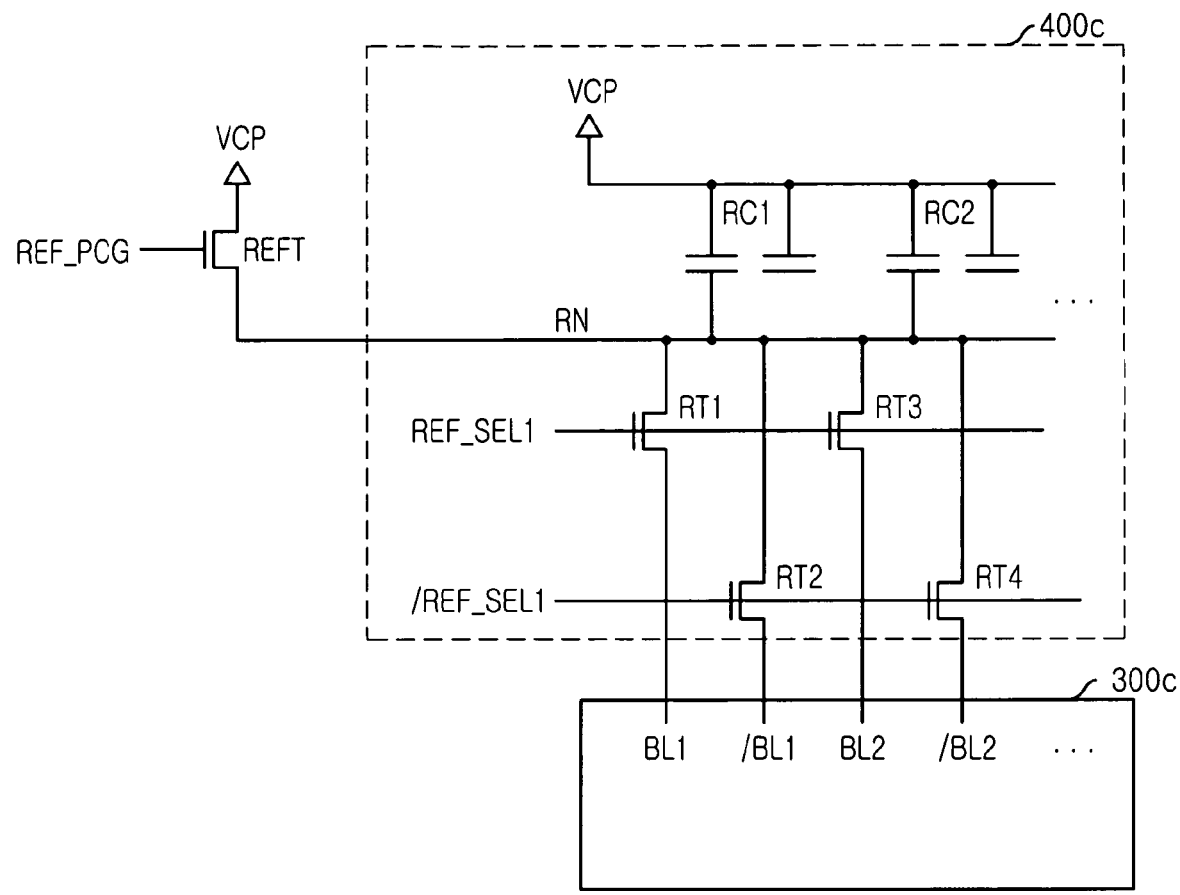
FIG. 9 is a circuit diagram of the first reference cell block shown in FIG. 8 in accordance with an embodiment of the present invention.

FIG. 9 is a circuit diagram of the first reference cell block shown in FIG. 8 in accordance with an embodiment of the present invention.

Referring to FIG. 9, the first reference cell block 400c includes reference capacitors RC1 and RC2, a first switching MOS transistor TR1, a second switching MOS transistor TR2, and a third switching MOS transistor REFT.

Each of the reference capacitors RC1 and RC2 has one terminal connected to a reference voltage terminal VCP. The first switching MOS transistor RT1 connects the other terminal of the reference capacitor RC1 to the bit line BL1 when the data signal is applied on the bit line bar /BL1. The second switching MOS transistor RT2 connects the other terminal of the reference capacitor RC1 to the bit line bar /BL1 when the data signal is applied on the bit line BL1. The third switching MOS transistor REFT connects the reference voltage terminal VCP to the other terminals of the reference capacitors RC1 and RC2 during the precharge period.

Here, each of the MOS transistors RT1 to RT4 is turned on in response to control signals REF_SEL1 and /REF_SEL1, and the MOS transistor REFT is turned on in response to the control signal REF_PCG.

The first reference cell block 400c includes N reference capacitors (e.g., RC1) corresponding to N bit line pairs (e.g., BL1 and /BL1) provided at the first cell array 300c. Accordingly, if a total of 256 bit line pairs are provided at the cell array, 256 reference capacitors RC1, RC2, . . . are provided at the first reference cell block 400c.

The reference capacitors RC1, RC2, . . . are provided with the same number of capacitors corresponding to one word line in the cell array. Only one of the two adjacent capacitors is used.

If the number of the normal capacitors corresponding to one word line in the cell array is 512, 512 capacitors are additionally provided for the reference capacitors. Only one of two adjacent capacitors is connected to the MOS transistors RT1 and RT2 and is used as the reference capacitors RC1, RC2, . . . . The other capacitor is used as a dummy capacitor. The reason is to manufacture the reference capacitors together with the normal capacitors.

The capacitance of the reference capacitors RC1 and RC2 is substantially equal to that of a unit cell capacitor (e.g., Cap1) provided at the cell array 300c.

The voltage level supplied from the reference voltage terminal VCP is half of the driving voltage used to drive the bit line sense amplifier.

An operation of the semiconductor memory device in accordance with an embodiment of the present invention will be described below with reference to FIG. 10.

Figure 10:
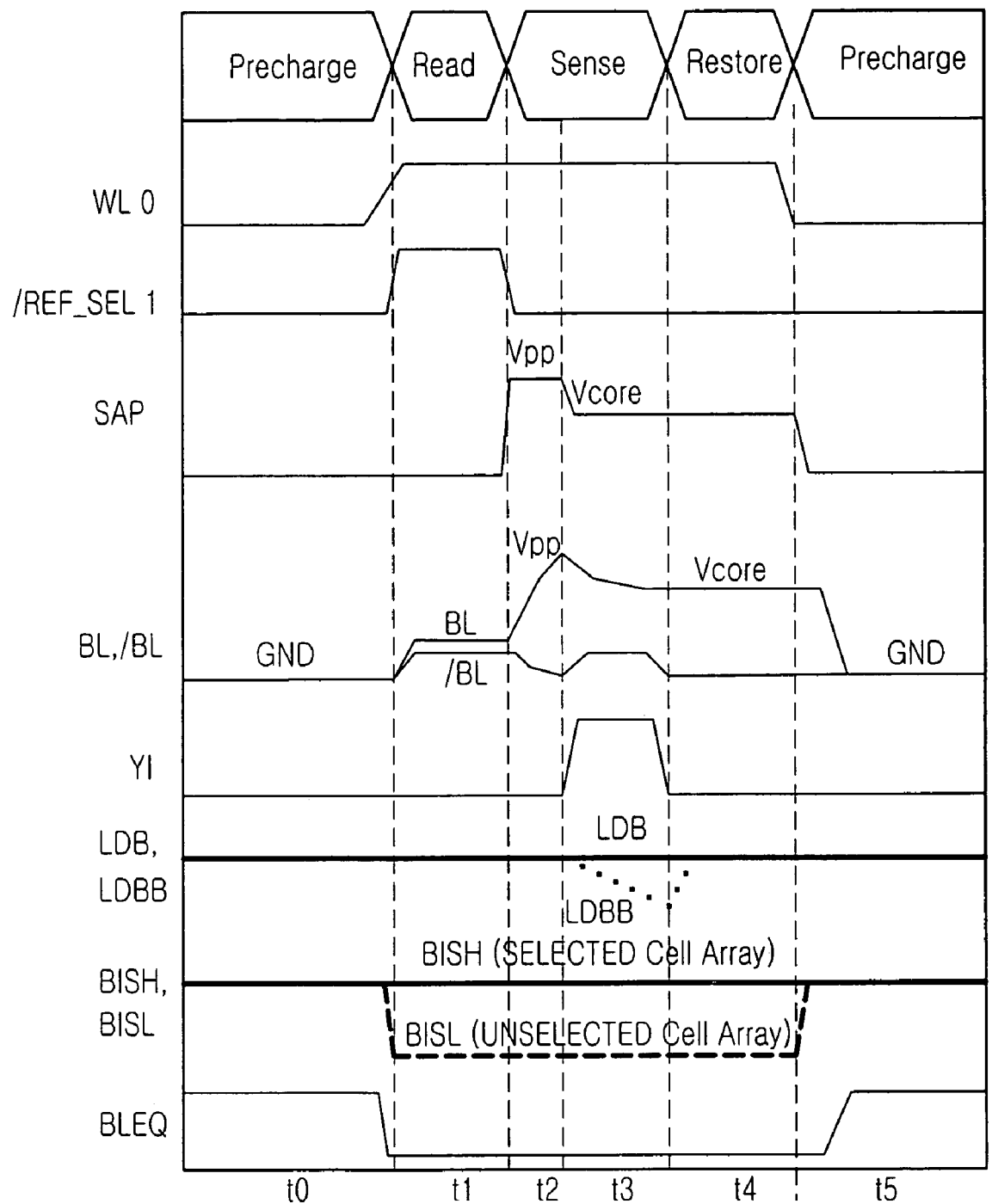
FIG. 10 is a waveform illustrating an operation of the semiconductor memory device shown in FIG. 8.

FIG. 10 is a waveform illustrating an operation of the semiconductor memory device shown in FIG. 8.

The semiconductor memory device in accordance with the present invention is characterized in that the ground voltage is used as the precharge voltage.

The semiconductor memory device has a folded bit line architecture. During the precharge period (t0), the precharge signal BLEQ is enabled to a high level to precharge the bit line BL and the bit line bar /BL to a ground voltage.

Then, during the read command period (t1), the read command is inputted to activate the word line WL. Thus, charges (it is assumed that the data "1" is stored in the capacitor so that the capacitor is charged) stored in the capacitor of the unit cell are applied to the bit line BL so that the voltage of the bit line BL increases partially. At this point, the precharge voltage BLEQ is deactivated to a low level.

Meanwhile, in the reference cell block connected to the bit line bar /BL, ½ of the charges stored in the capacitor of the unit cell are supplied to the bit line bar /BL in response to the reference signal /REF_SEL1, thereby increasing the voltage of the bit line bar /BL. Accordingly, the rising voltage level in the bit line bar /BL becomes about half the rising voltage level in the bit line /BL.

Then, during a predetermined period (t2), the high voltage Vpp higher than the core voltage Vcore is applied as the driving voltage SAP together with the ground voltage GND, and the bit line sense amplifier senses and amplifies the signal difference between the bit line and the bit line bar. Since the voltage level of the bit line BL is higher than that of the bit line bar /BL, the level of the bit line BL is amplified to the core voltage Vcore that is the driving voltage, and the level of the bit line bar /BL is amplified to the ground voltage.

At this time, the level of the bit line BL is temporarily increased up to the high voltage level due to the high voltage and is then stabilized to the core voltage level.

Then, the I/O control signal Y1 is activated to a high level during a predetermined period (t3) and the data latched in the sense amplifier is outputted to the data lines LDB and LDBB in response to the I/O control signal Y1. The outputted data is a data outputted corresponding to the read command.

At this point, since the data lines LDB and LDBB are precharged to the core voltage or ½ core voltage while the data is not transferred, the voltage level of the bit line bar /BL maintains a temporary increase from the ground voltage.

During the restore period (t4), the data latched in the bit line sense amplifier is restored in the unit cell where the data signal has been stored.

After the restore operation is finished (t5), the word line WL is deactivated to a low level, the driving voltage SAP is not supplied to the sense amplifier, and the precharge signal BLEQ is activated to a high level. When the precharge signal BLEQ is activated to the high level, the bit line pair BL and /BL are precharged to the ground voltage.

Till now, the operation of reading the data "1" in the semiconductor memory device has-been described. An operation of reading data "0" will be described below.

An overall operation is similar to the above-described operation. If the data "0" is read, the capacitor of the selected unit cell is not charged. Accordingly, the level of the bit line BL to which the data signal is applied during the read command period (t1) is maintained as it is.

Meanwhile, the reference signal Y1 stored in the reference capacitor RC1 is applied to the bit line bar /BL and thus increases by a predetermined voltage level. The applied reference signal supplies charges from the reference cell blocks 400a and 400b to the bit line bar /BL by ½ of the charges accumulated in the capacitor that stores the data as described above. The charges corresponding to the reference signal are set to ½ of the data signal so as to determine the data "1".

The bit line sense amplifier 210 senses and amplifies the voltage difference between the bit line BL maintained at the ground voltage and the bit line bar /BL receiving the reference signal and increasing up to a predetermined voltage level.

A write operation of the semiconductor memory device in accordance with an embodiment of the present invention will be described below. The write operation is performed as shown in FIG. 10. During the period (t3) of outputting the data to the external data lines LDB and LDBB, the data inputted in response to the current write command is transferred to the bit line sense amplifier 210 through the data lines LDB and LDBB.

The bit line sense amplifier 210 latches the transferred data instead of the previously latched data, and the latched data is stored in the corresponding unit cell during the restore period (t4). When the write command is executed, the bit line sense amplifier 210 receives the high voltage higher than the core voltage Vcore as the driving voltage in the initial sensing and amplifying operation, and performs the amplifying operation at a high speed.

As described above, the semiconductor memory device precharges the bit line during the precharge period, and the bit line sense amplifier 210 receives the high voltage Vpp as the driving voltage during the initial period of sensing and amplifying the voltage difference between two bit lines BL and /BL, and then receives the core voltage Vcore.

If the bit line sense amplifier 210 operates with the high voltage Vpp in the initial operation, the high-speed sensing and amplifying operation cannot be performed.

If the voltage of the bit line precharged to the ground voltage is to be amplified to the core voltage Vcore, the voltage level must be increased much more than the case where the bit line is precharged to ½ core voltage. The voltage of the bit line can be increased effectively by using the high voltage Vpp.

The use of the ground voltage as the precharge voltage has the following effects.

First, the operating margin of the sense amplifier can be increased greatly compared with that of the prior art. If the precharge voltage is set to ½ core voltage, the sense amplifier amplifies the voltage from ½ core voltage to the ground voltage or the power supply voltage. For example, when the driving voltage is 1.5 V, the sense amplifier amplifies the voltage from 0.75 V to 0 V or 1.5 V.

When the driving voltage is high (e.g., about 5 V), even though ½ core voltage is used as the precharge voltage, there is no problem in amplifying the voltage from 2.5 V to 5V or 0 V. However, when the driving voltage is low (e.g., about 1.5), the voltage to be amplified is low to about 0.75 V. Thus, an error may occur when noise is generated. That is, due to noise that is spontaneously at 0.75 V, the sense amplifier may amplify the voltage level of the bit line to the core voltage or the ground voltage. At. this point, the voltage level of the bit line may be amplified inversely to the voltage level to be amplified.

However, since the present invention uses the ground voltage as the precharge voltage, the voltage that must be amplified when the driving voltage is 1.5V is 1.5 V (in the case of the data "1"). Accordingly, even when the driving voltage level is low, the stable amplifying operation can be possible. In the case of the data "0", the voltage level of the bit line opposite to the bit line to which the reference voltage is applied is amplified up to the core voltage of 1.5 V.

Accordingly, even when the driving voltage is low, the semiconductor memory device can operate stably against noise.

Second, it is possible to prevent the bleed current occurring when the word line and the bit line in the unit cell are electrically shorted; As described above, even though the defective word line is replaced with the dummy word line, the bleed current continuously flows, resulting in the unnecessary power consumption.

However, since the present invention uses the ground voltage as the precharge voltage of the bit line, the voltage difference between the word line and the bit line does not occur and thus the bleed current does not flow.

Third, in the initial operation of the sense amplifier, the high voltage higher than the driving voltage is used for the sensing operation. Therefore, even when the driving voltage is low, the sense amplifier can sense and amplify the data signal applied to the bit line at a high speed.

Figure 11:
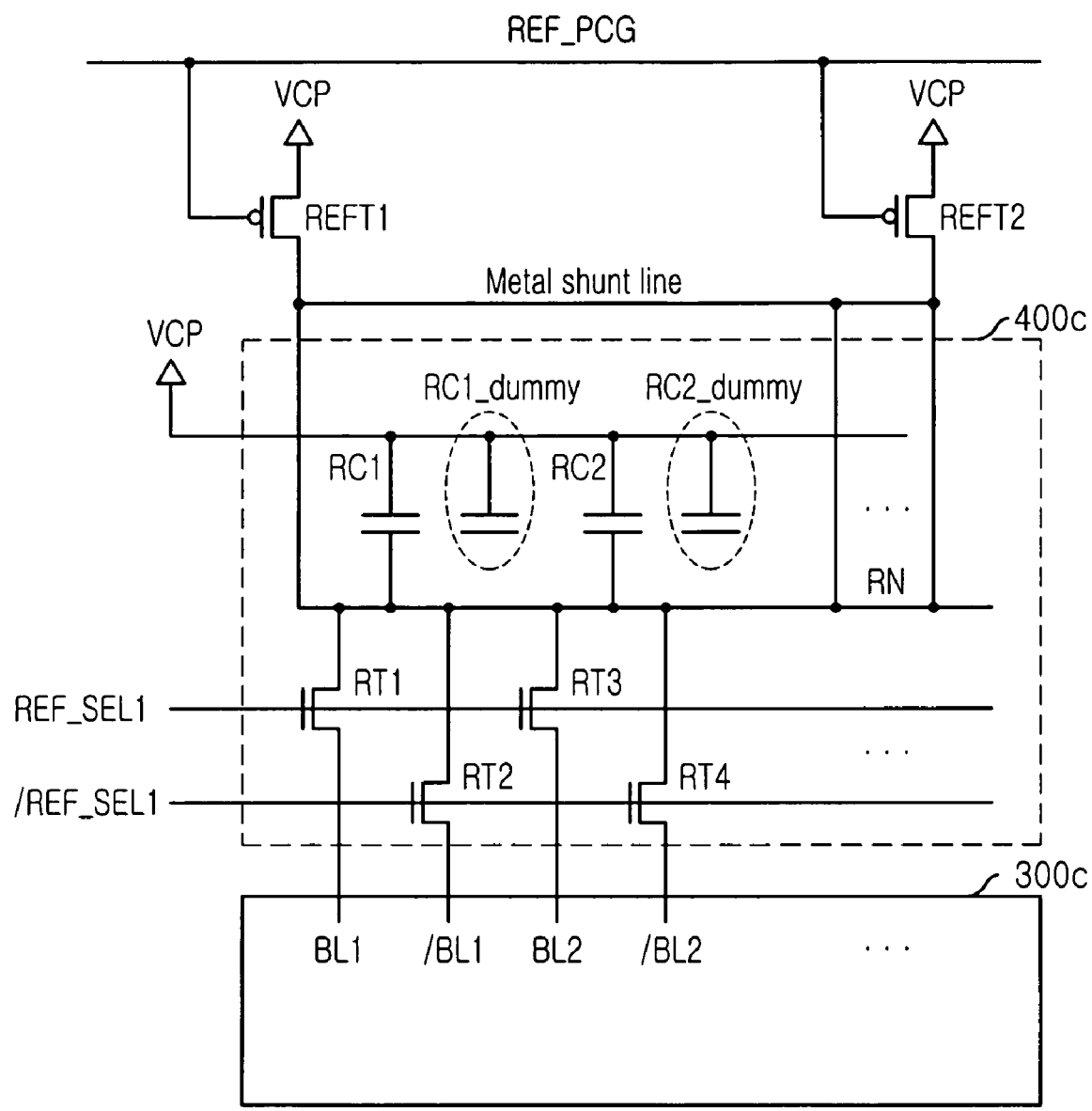
FIG. 11 is a circuit diagram of a first reference cell block shown in FIG. 8 in accordance with a second embodiment of the present invention.

FIG. 11 is a circuit diagram of a first reference cell block shown in FIG. 8 in accordance with a second embodiment of the present invention.

Referring to FIG. 8, a basic structure is similar to the reference cell block shown in FIG. 9, but a difference is that a plurality of MOS transistors REFT1 and REFT2 are provided to supply a reference voltage VCP to one side of the reference capacitor during a precharge period.

The capacitors are provided as many as the normal capacitors corresponding to one word line of the cell array. One of them is used as the reference capacitor and the others are used as the dummy capacitors.

Accordingly, when one MOS transistor is used to supply the reference voltage to one node of all reference capacitors during the precharge period, a delay time is inevitably required when supplying the reference voltage VCP of the same level to one terminal of all reference capacitors.

In order to solve that, a plurality of MOS transistors REFT1 and REFT2 are provided to apply the reference voltage to all reference capacitors arranged in one row at a fast timing during the precharge period.

Also, the first reference cell block in accordance with the second embodiment of the present invention further includes a metal shunt line for connecting each drain of the plurality of MOS transistors REFT1 and REFT2 so that the voltage level supplied to the plurality of MOS transistors REFT1 and REFT2 can be equal to one another. The metal shunt line can be formed using a line among metal lines.

Figure 12A:
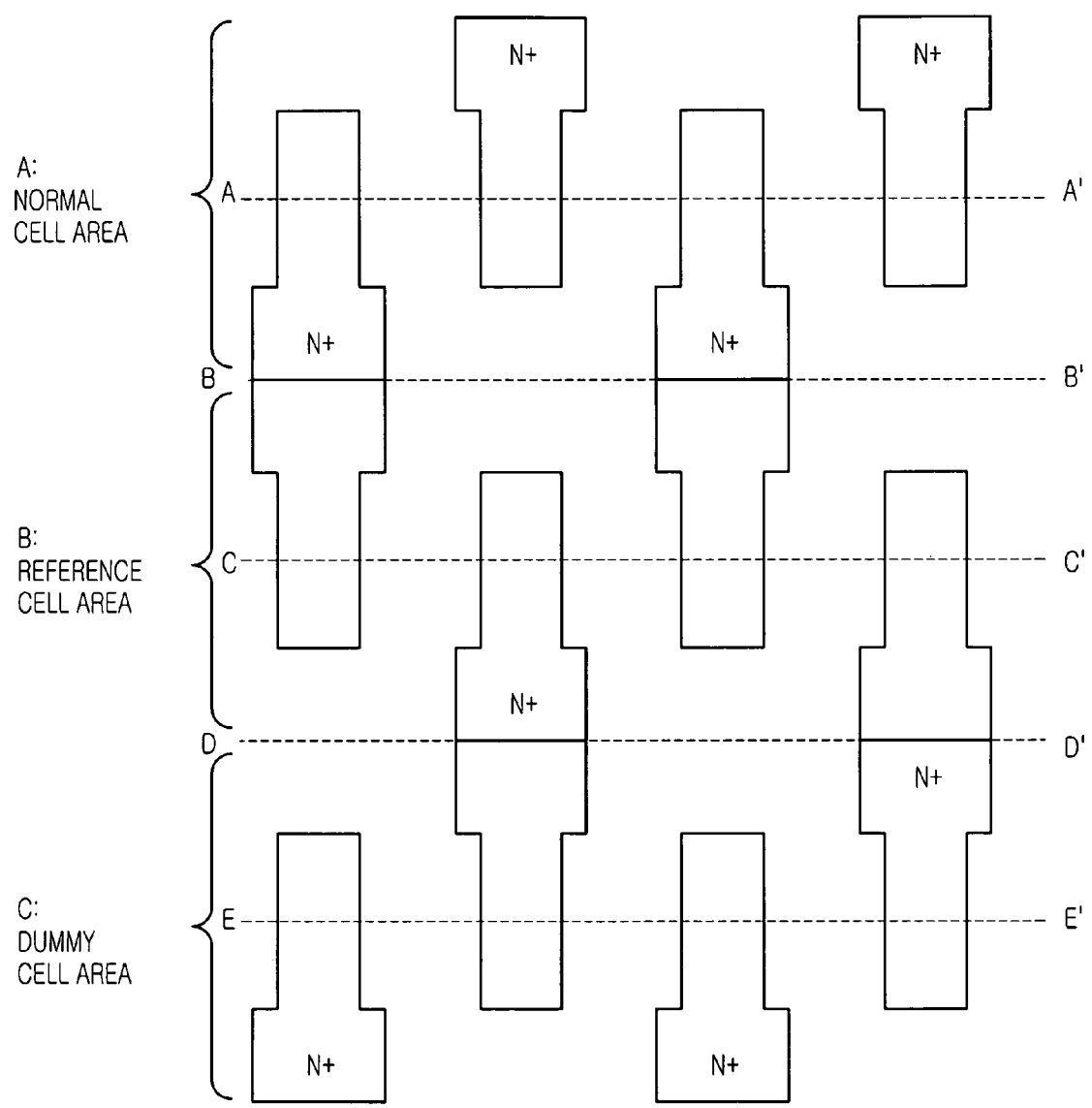
Figure 12B:
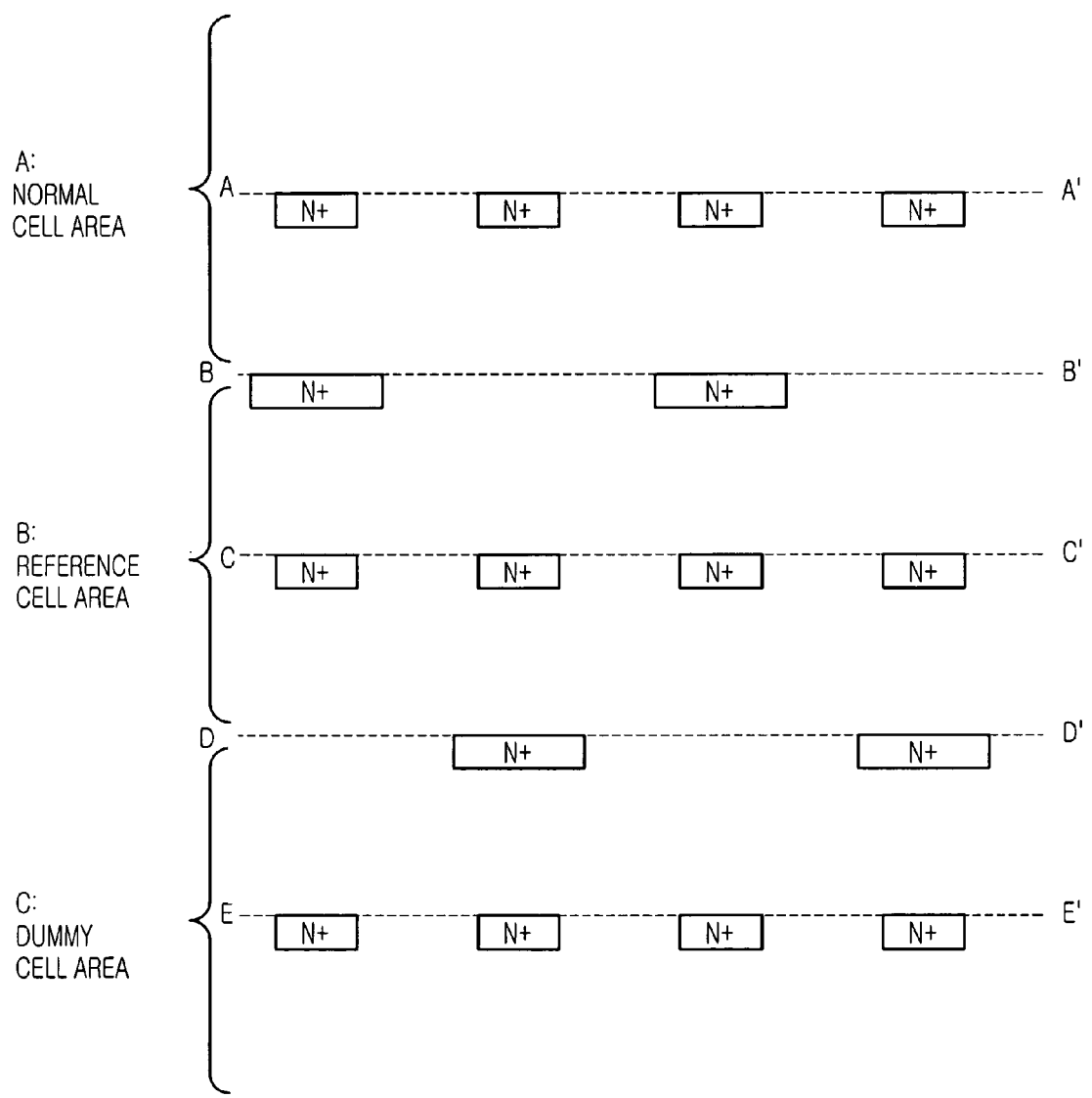
Figure 13A:
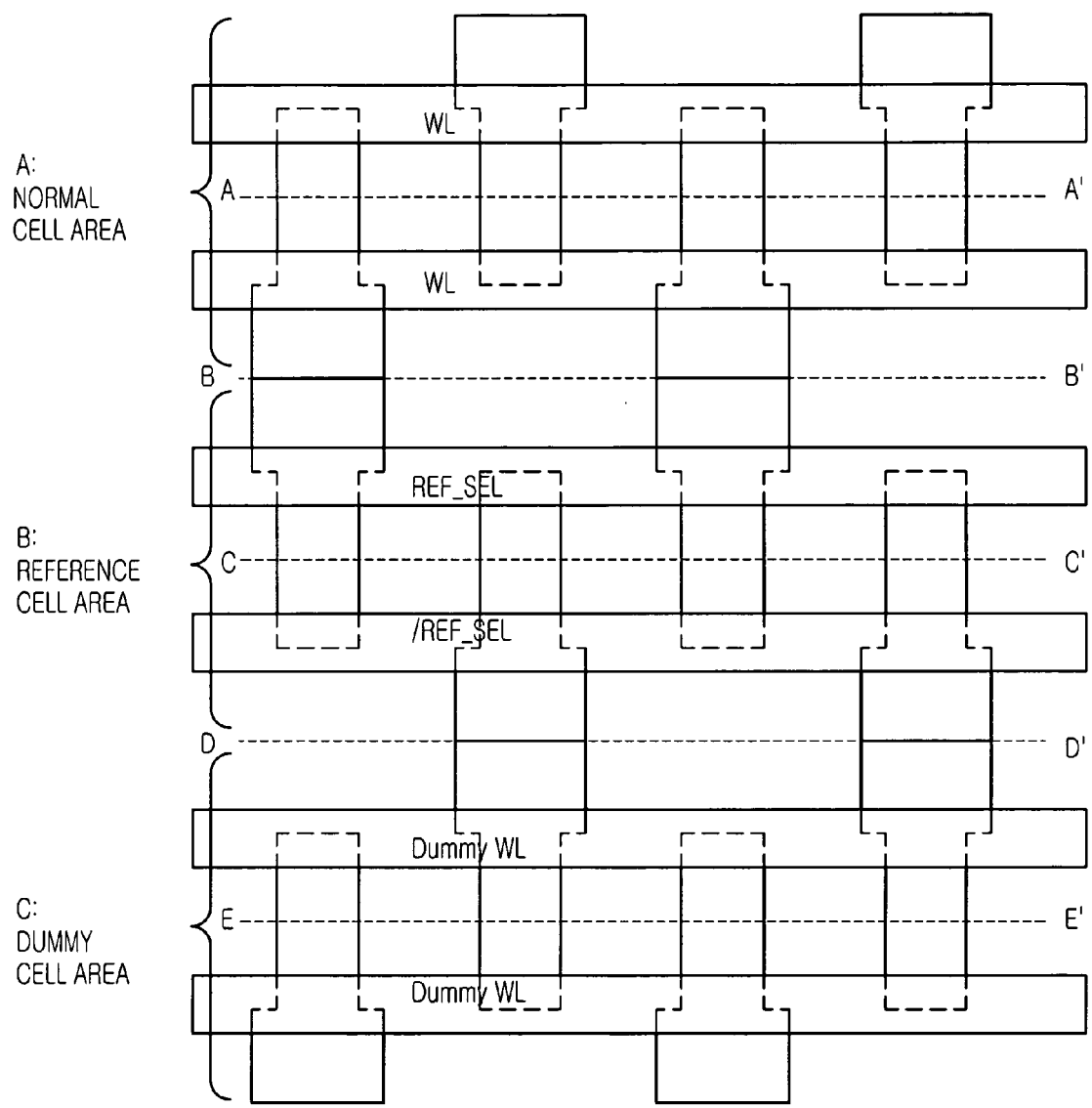
Figure 13B:
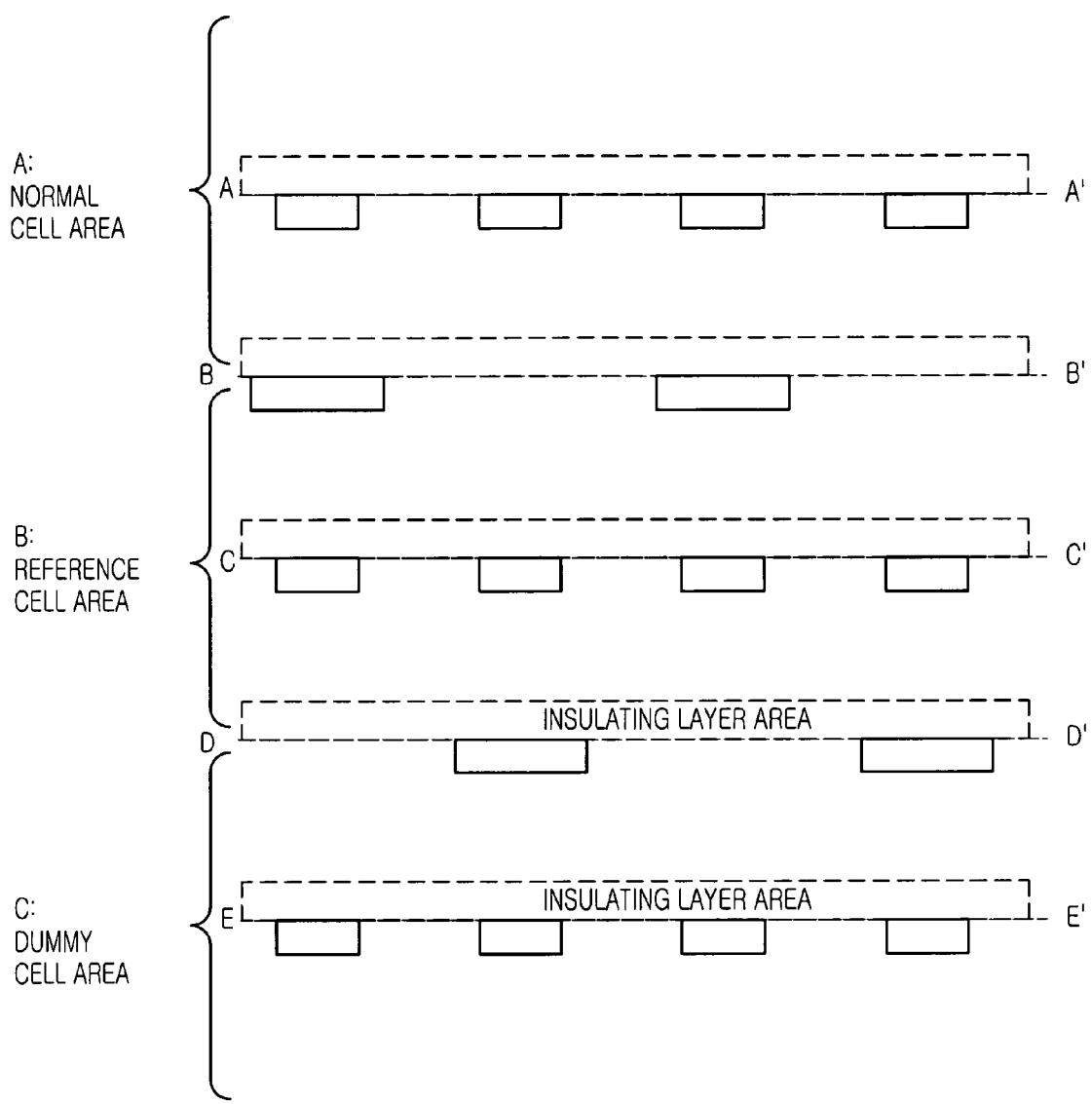

FIGS. 12A, 13A, . . . , and 19A are layouts of the semiconductor memory device in accordance with the present invention. In particular, the cell array and the reference cell block are illustrated. FIGS. 12B, 13B, . . . , and 19B are sectional views taken along the lines A-A', B-B', C-C', D-D' and E-E' of FIGS. 12A to 19A.

The layout of the semiconductor memory device in accordance with the present invention will be described below with reference to FIGS. 12A to 19A and 12B to 19B.

A characteristic is that the reference capacitors RC1 and RC2 and the reference MOS transistors RT1, RT2, RT3 and RT4 are arranged at the cell array area. The reference capacitors RC1 and RC2 and the reference MOS transistors RT1, RT2, RT3 and RT4 are laid out with the almost equal patterns to that of the normal capacitors and the normal MOS transistors.

Since the reference capacitors RC1 and RC2 use one of two adjacent capacitors, a storage node contact plug is formed at only one of the two reference capacitors.

Also, landing plugs at the storage node contact side of all reference MOS transistors is connected to one node, which is a node RN shown in FIG. 11.

The MOS transistor REFT1 for the reference cell is arranged at an outer portion of the cell array.

As shown in FIGS. 12A and 12B, in the layout of the reference block, an active area (N+) is formed on a substrate.

Here, the dummy cell area is a pattern formed at an edge of the cell array and is left as the dummy for the manufacturing stability.

As shown in FIGS. 13A and 13B, the word lines are formed.

In FIG. 13A, two upper word lines WL are provided for the normal MOS transistors, and next two word lines REF_SEL and /REF_SEL are provided for the reference MOS transistors.

Figure 14A:
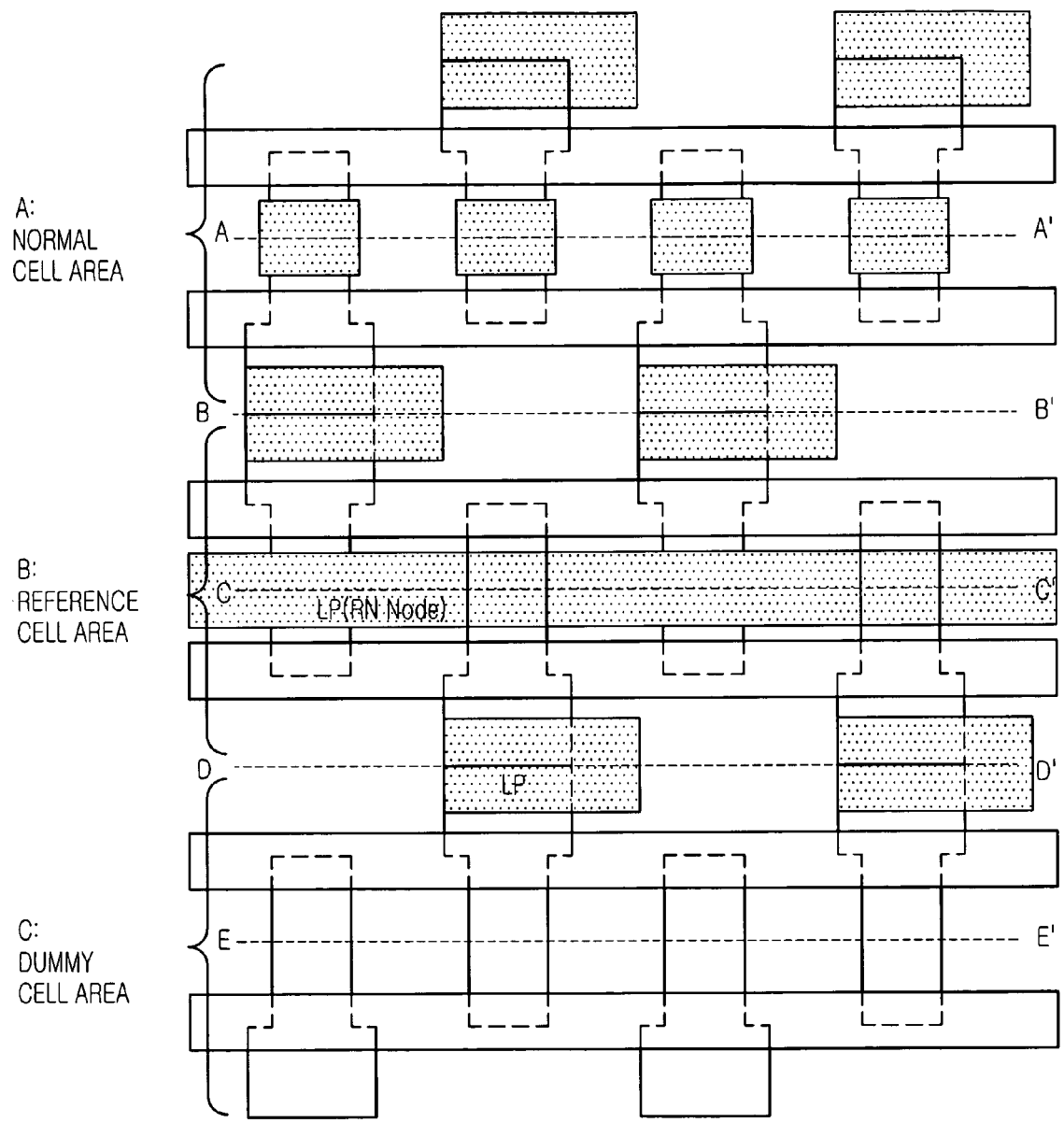
Figure 14B:
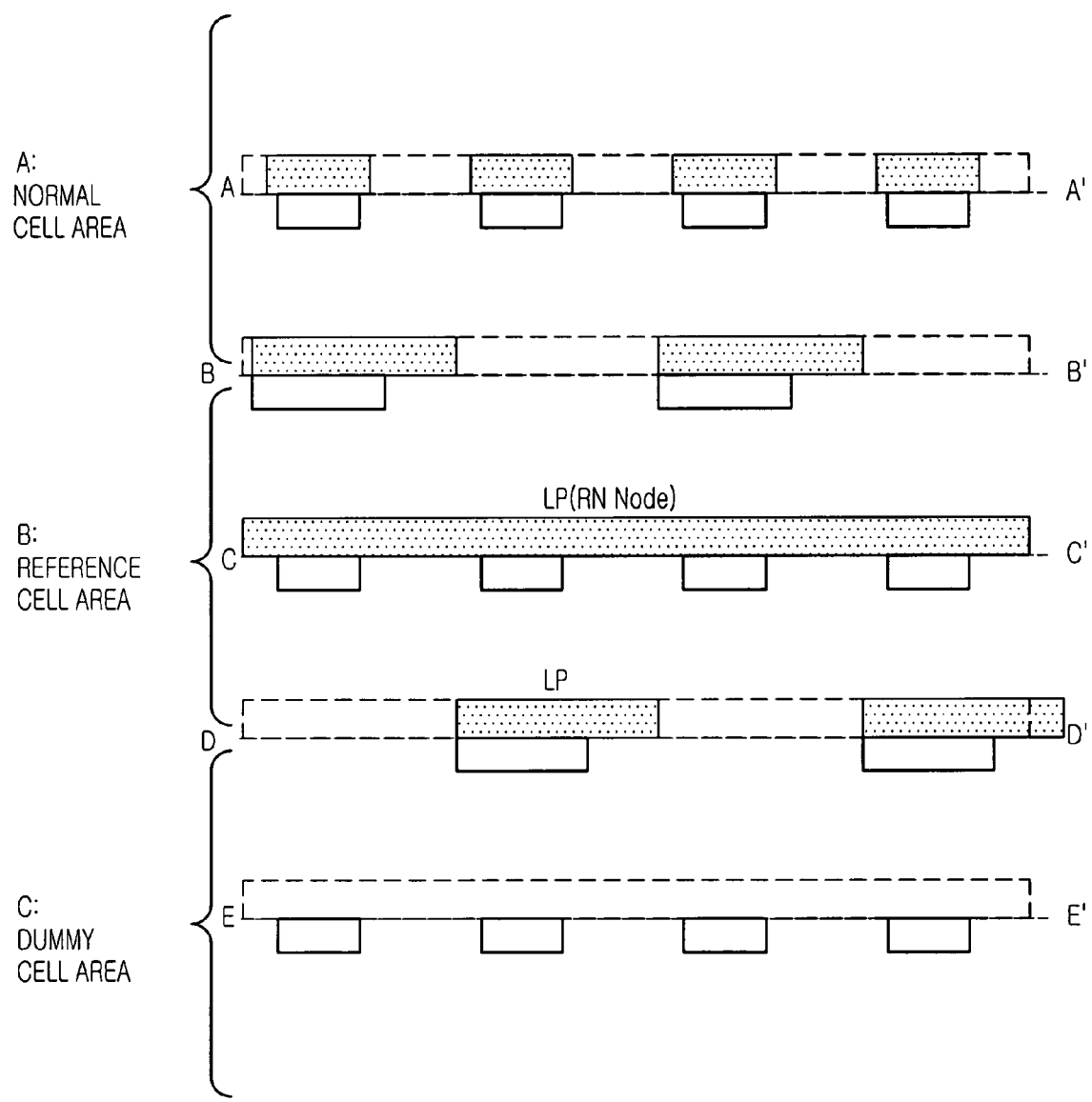

As shown in FIGS. 14A and 14B, the landing plugs LP are formed.

The landing plugs LP are contact plugs that are in contact with the source and drain of each MOS transistor in the cell array area. The landing plug LP that is in contact with the source of the MOS transistor is contacted with the storage node contact plug at its upper portion, and the landing plug LP that is contact with the drain of the MOS transistor is contacted with the bit line contact plug at its upper portion.

As shown in FIGS. 14A and 14B, the landing plugs LP are formed at the adjacent active areas in the normal cell area. In the reference cell area, the landing plug formed at a portion where the bit line contact plug is to be contacted is formed together with the main cell area. However, the landing plug formed at a portion where the storage node contact plug is to be contacted is formed by connecting it with one pattern.

Here, the connected pattern becomes a node RN of the circuit shown in FIG. 9.

Figure 15B:
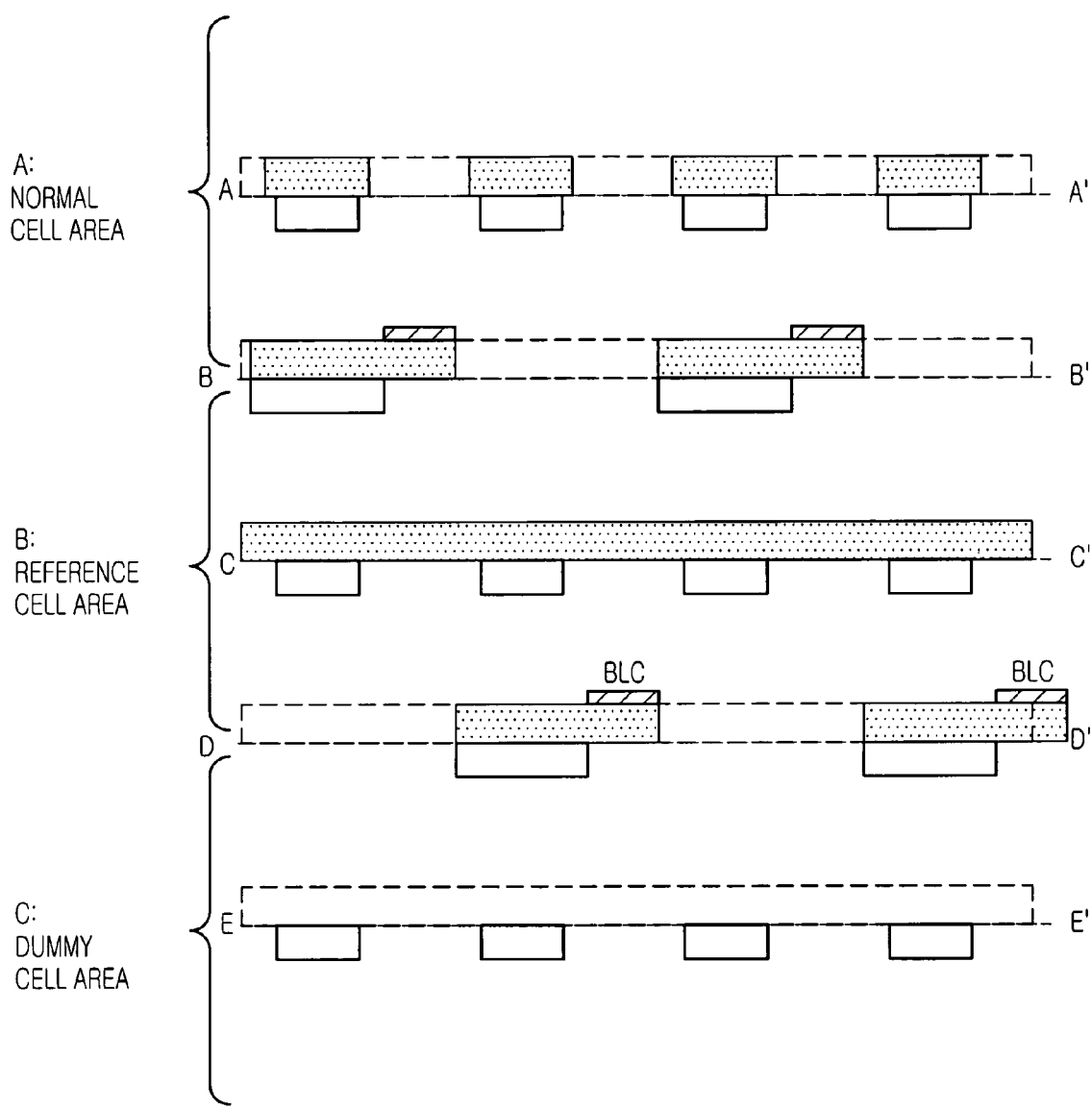

As shown in FIGS. 15A and 15B, the bit line contact plug (BLC) is formed on the landing plug where the bit line contact plug of the normal cell area and the reference cell area is to be formed.

Figure 16A:
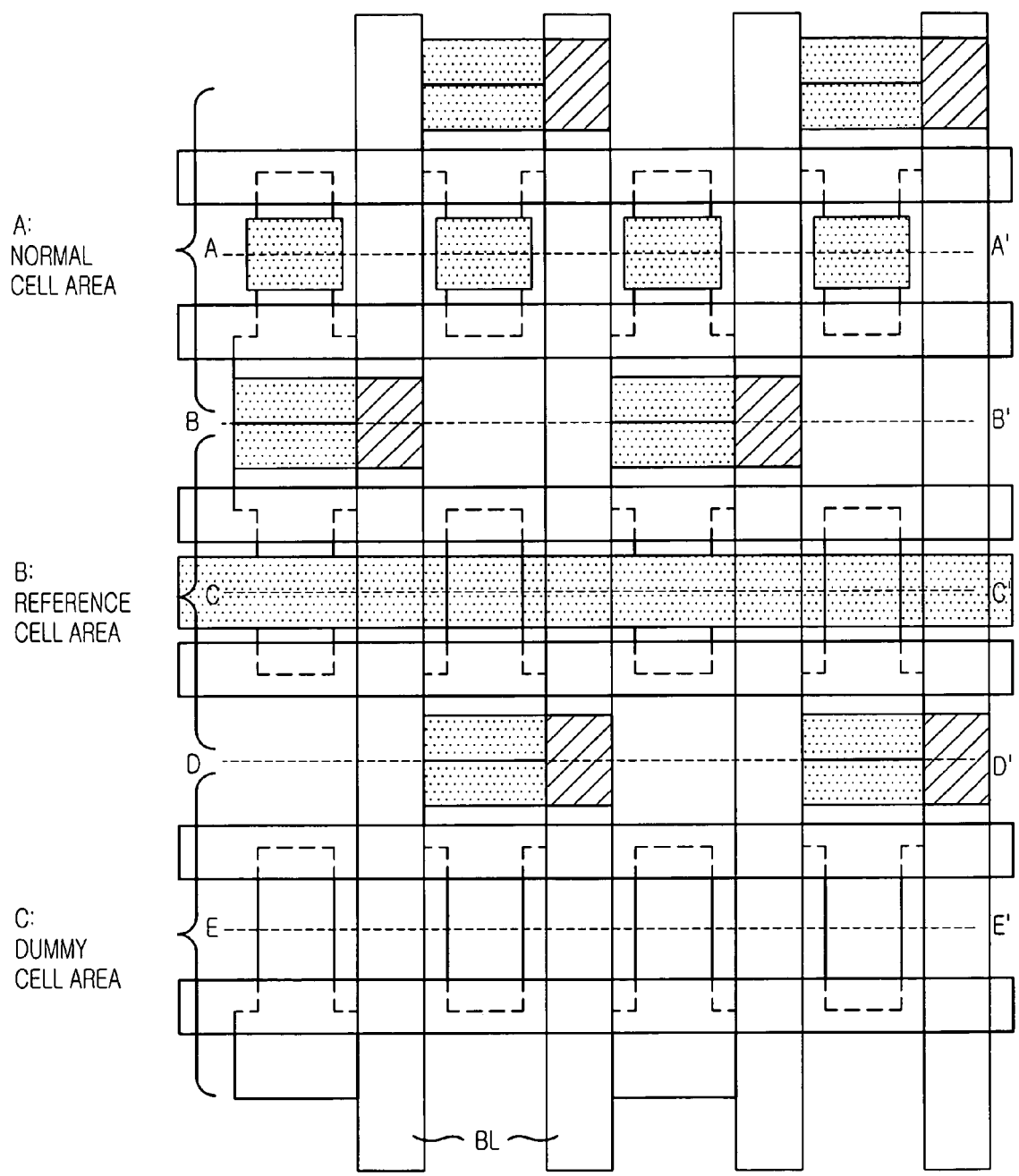
Figure 16B:
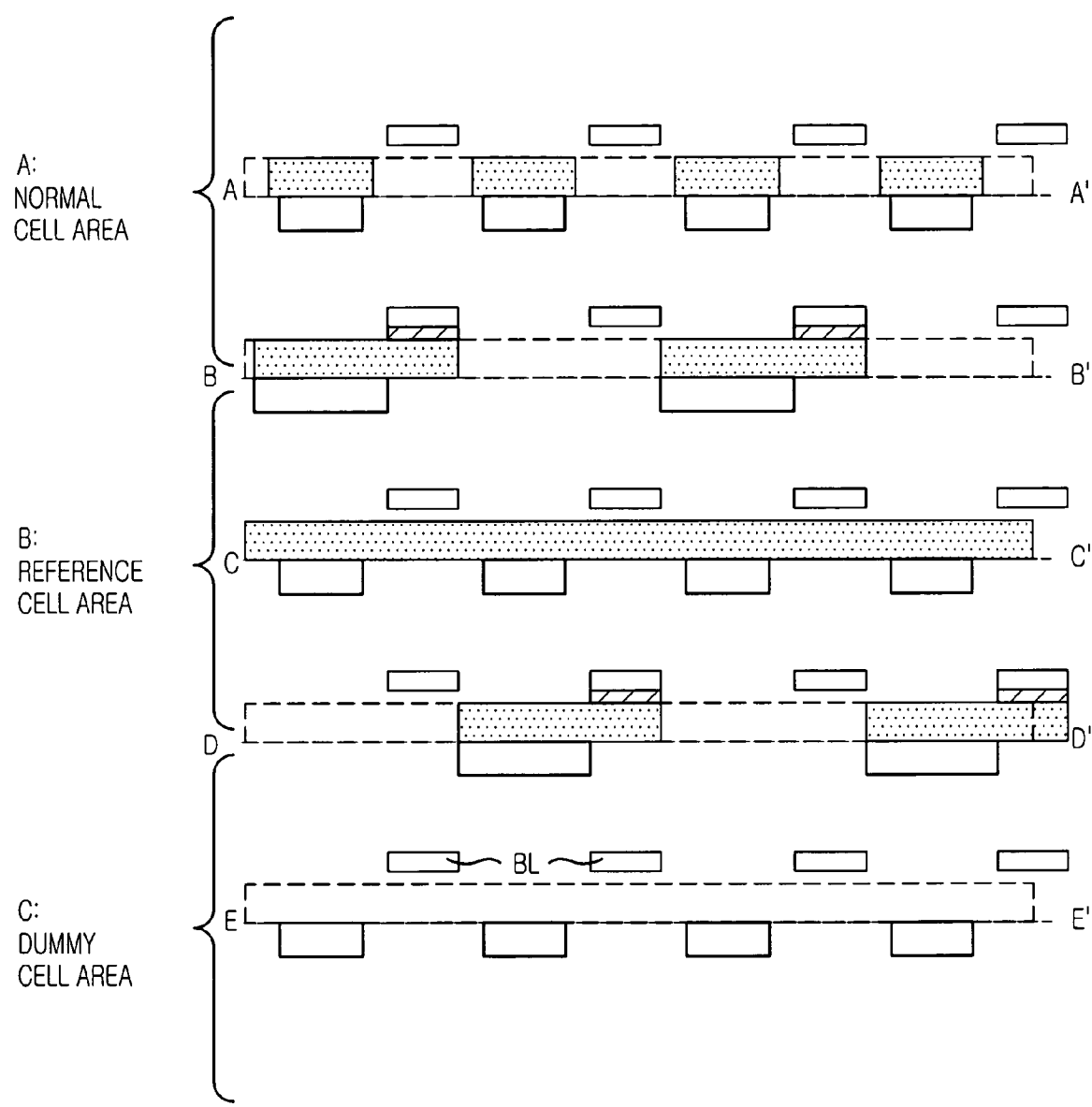

As shown in FIG. 16A and 16B, the bit line BL is formed to contact with the bit line contact plug BLC. At this point, the bit lines intersected with the word lines form the bit line and the bit line bar alternately.

Figure 17A:
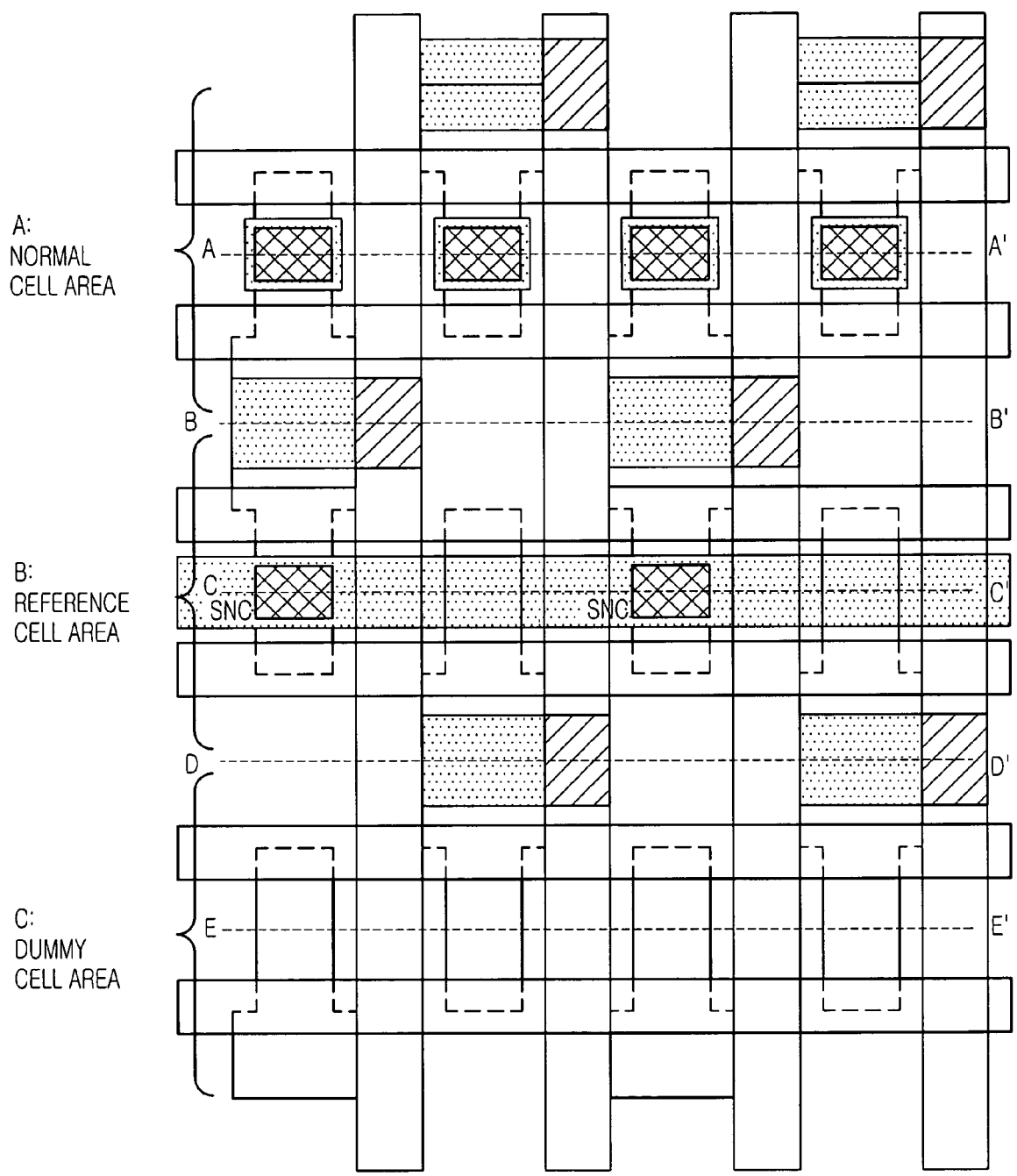
Figure 17B:
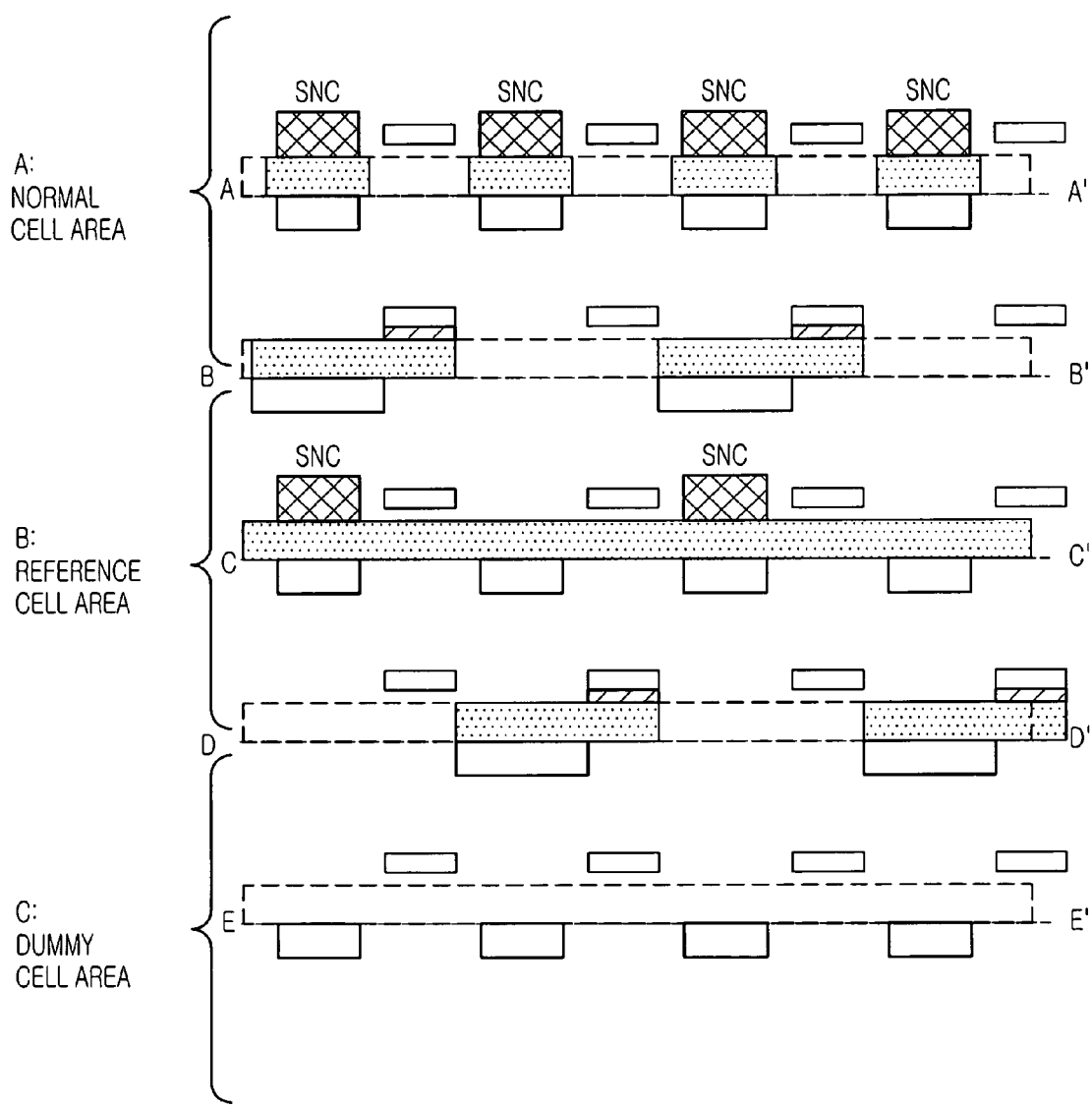

As shown in FIGS. 17A and 17B, the storage node contact plug SNC is formed on the landing plug to be contacted with the storage node contact plug.

At this point, the normal cell area forms a plurality of storage node contact plugs SNC at regular intervals. Since only one of the two capacitors formed at the reference cell area is used as the reference capacitor, the storage node contact plugs SNC are formed alternately.

Figure 18A:
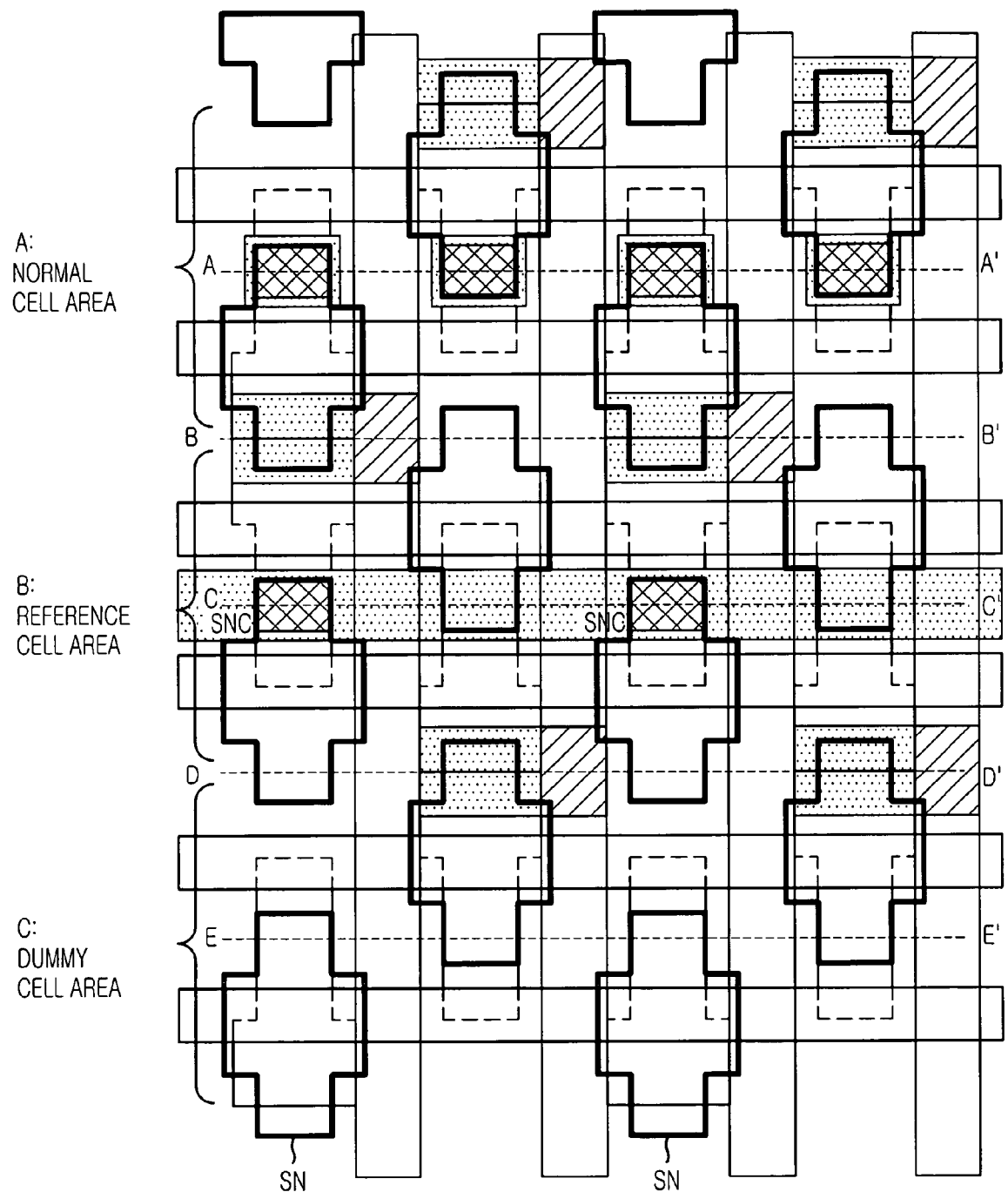
Figure 18B:
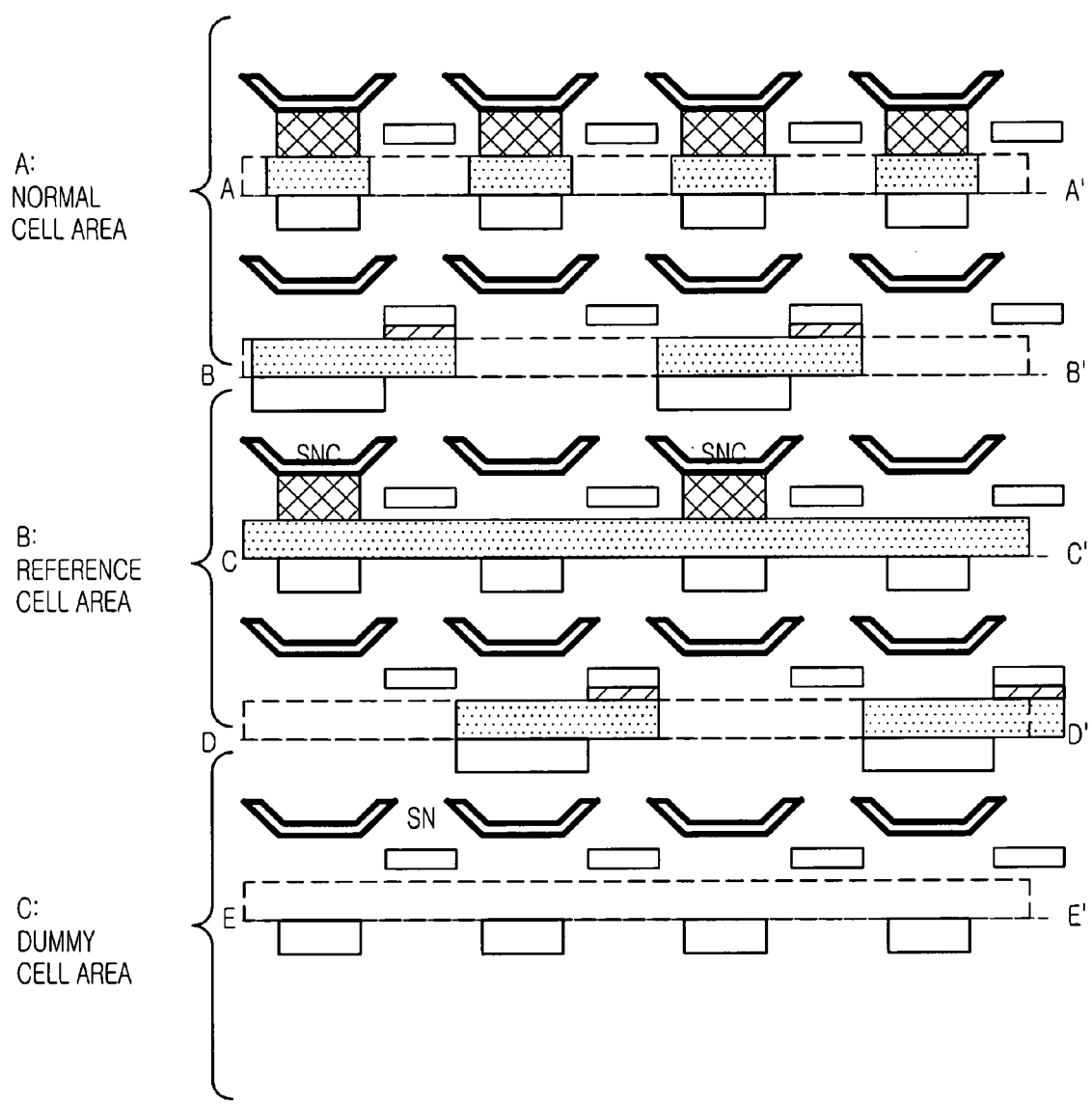

As shown in FIGS. 18A and 18B, the storage nodes (lower electrodes) of the capacitors are formed in a matrix at regular intervals.

Since the storage node contact plugs are formed at the normal cell area at regular intervals, the storage nodes of the capacitors are connected on all storage node contact plugs.

Also, since one storage node contact plug per two areas is formed at the reference cell area, only one of the storage nodes of the two adjacent capacitors is connected to the storage node contact plug formed at the lower portion, even though the capacitors are all formed at regular intervals.

Figure 19A:
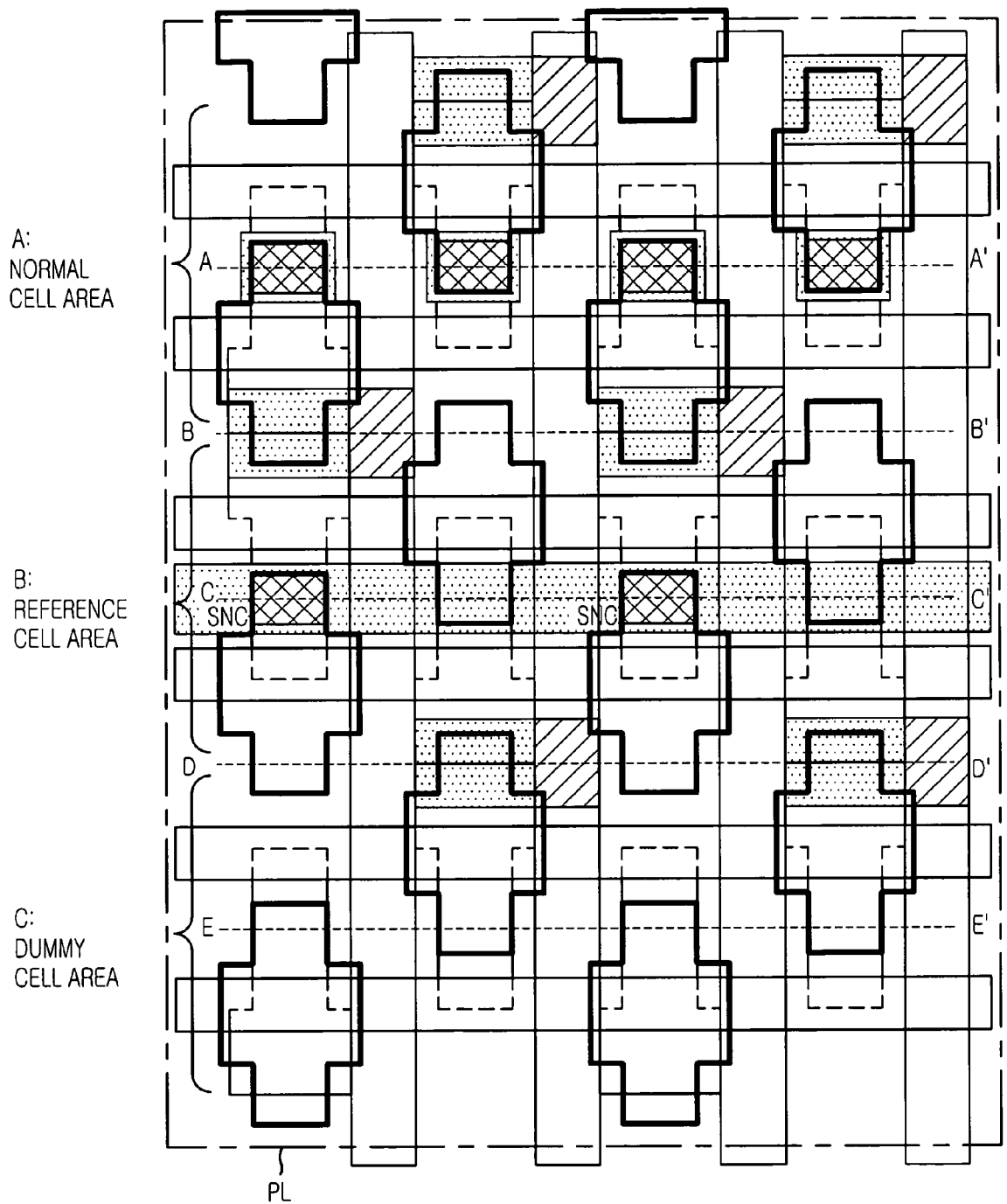
Figure 19B:
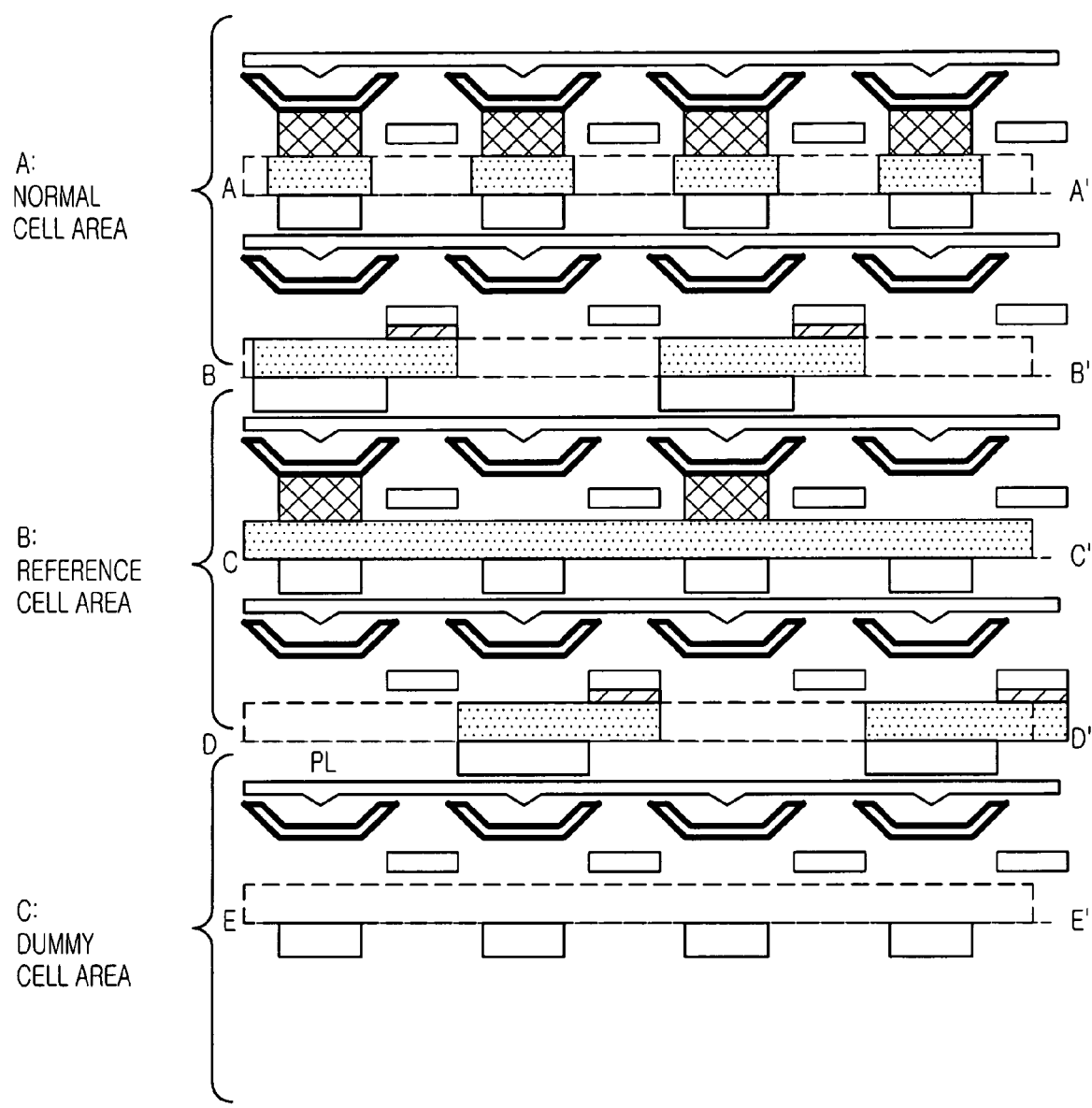

As shown in FIGS. 19A and 19B, a dielectric layer and a plate electrode of the capacitor are formed.

As described above, by forming the capacitors and the MOS transistors of the reference cell block with the same pattern of the normal cell, the reference cell block circuit can be integrated in the cell array area with the same circuit area as the prior art.

Also, since the capacitor and MOS transistor for the reference are formed in the almost same process of the normal cell area, no additional cost is required. However, the landing plug and the storage node contact plug are separately formed for the reference MOS transistors.

In accordance with the present invention, it is possible to easily implement the semiconductor memory device that operates at a low voltage (e.g., 1.5 V).

Also, the bit line sense amplifier does not sense and amplify the data from ½ core voltage to the ground voltage or the core voltage. Instead, the bit line sense amplifier senses and amplifies the data from the ground voltage to the core voltage or maintains the precharged ground voltage. Therefore, the operating margin greatly increases compared with the semiconductor memory device using ½ core voltage.

In addition, the semiconductor memory device uses the ground voltage, not ½ core voltage, as the precharge voltage for precharging the bit lines. Accordingly, even when the word line and the bit line are electrically shorted, all of the voltages applied to the word line and the bit line become the ground voltage, so that the bleed current does not occur. Consequently, there is no power consumption wasted due to the bleed current.

Further, since the semiconductor memory device is driven with the voltage higher than the driving voltage during the initial operation of the sense amplifier, it is possible to sense and amplify the data signal of the bit line at a high speed even at the low voltage.

Furthermore, the reference cell block uses the layers applied to the normal cell array and is implemented with the design rule used in the layout of the normal cell. Therefore, additional cost is not needed in the manufacturing process.

The present application contains subject matter related to Korean patent application No. 2004-110393, filed in the Korean Patent Office on Dec. 22, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a cell array area for reading or storing data, comprising:
   a normal cell block including a plurality of normal cells, each being coupled to one of a bit line and a bit line bar for storing a data;
   a reference cell block including a plurality of reference cell units, each including a reference capacitor having one terminal coupled to a reference voltage terminal, a first reference metal oxide semiconductor (MOS) transistor for connecting the reference capacitor to the bit line, and a second reference MOS transistor for connecting the reference capacitor to the bit line bar; and
   a reference voltage supply unit having a third reference MOS transistor for connecting the reference voltage terminal to the other terminal of the reference capacitor to charge the reference capacitor with a reference voltage during a precharge period.

2. The semiconductor memory device as recited in claim 1, further comprising:
   a precharge block for precharging the bit line and the bit line bar as a ground; and
   a sense amplifying block for sensing and amplifying the data by using a core voltage for operating the semiconductor memory device and a high voltage having a higher voltage level than the core voltage.

3. The semiconductor memory device as recited in claim 2, wherein the high voltage is inputted to the sense amplifying block during a predetermined period from a timing of starting to sense and amplify the data.

4. The semiconductor memory device as recited in claim 3, wherein the core voltage is inputted to the sense amplifying block after the predetermined period.

5. The semiconductor memory device as recited in claim 2, wherein the precharge block includes:
   a first MOS transistor for receiving a precharge signal and supplying the ground to the bit line as the precharge voltage in response to the precharge signal; and
   a second MOS transistor for receiving the precharge signal and supplying the ground to the bit line bar as the precharge voltage in response to the precharge signal.

6. The semiconductor memory device as recited in claim 2, wherein the sense amplifying block includes:
   a first p-type metal oxide semiconductor (PMOS) transistor having a gate, a drain and a source, the gate coupled to the bit line bar, the source for receiving one of the core voltage and the high voltage and the drain coupled to the bit line;
   a second PMOS transistor having a gate, a drain and a source, the gate coupled to the bit line, the source for receiving one of the core voltage and the high voltage and the drain coupled to the bit line bar;
   a first n-type metal oxide semiconductor (NMOS) transistor having a gate, a drain and a source, the gate coupled to the bit line bar, the source for receiving the ground and the drain coupled to the bit line; and a second NMOS transistor having a gate, a drain and a source, the gate coupled to the bit line, the source for receiving the ground and the drain coupled to the bit line bar.

7. The semiconductor memory device as recited in claim 2, further comprising a data output block for delivering the data amplified by the sense amplifying block into a data line and a data line bar or delivering an inputted data through the data line and the data line bar into the sense amplifying block.

8. The semiconductor memory device as recited in claim 7, wherein the data output block includes:
a first MOS transistor coupled between the bit line and the data line for delivering a data loaded in the bit line into the data line; and
a second MOS transistor coupled between the bit line bar and the data line bar for delivering a data loaded in the bit line bar into the data line bar.

9. The semiconductor memory device as recited in claim 2, further comprising an internal voltage generator for receiving a power supply voltage inputted to the semiconductor memory device to thereby generate the core voltage and the high voltage.

10. The semiconductor memory device as recited in claim 2, further comprising:
a connection block for connecting or disconnecting the normal cell block to the sense amplifying block in response to a connection signal.

11. The semiconductor memory device as recited in claim 10, wherein the connection signal based on inputted address and command is activated during a precharging operation.

12. The semiconductor memory device as recited in claim 1, wherein the normal cell block includes:
a first normal cell including a first normal capacitor and a first normal MOS transistor for connecting the normal capacitor to the bit line; and
a second normal cell including a second normal capacitor laid out with the same pattern as the first normal capacitor and a second normal MOS transistor laid out with the same pattern as the first normal MOS transistor to connect the second normal capacitor to the bit line bar.

13. The semiconductor memory device as recited in claim 12, wherein the first and second reference MOS transistors are laid out with the same pattern as the second normal MOS transistor, and the reference capacitor is laid out with the same pattern as the second normal capacitor.

14. The semiconductor memory device as recited in claim 12, wherein the third reference MOS transistor is laid out at an outer portion of the cell array area.

15. The semiconductor memory device as recited in claim 12, wherein one reference cell per two bit lines is laid out.

16. The semiconductor memory device as recited in claim 12, further comprising a contact plug to be contacted with a normal storage node corresponding to each source of the first and second normal MOS transistors, wherein each source of the first and second reference MOS transistors is laid out to be connected to each contact plug in order for connection with a common reference storage node.

17. The semiconductor memory device as recited in claim 12, wherein the cell array area includes:
a first active area for the second normal MOS transistor;
a second active area for the first normal MOS transistor and the first reference MOS transistor;
a third active area for the second reference MOS transistor;
a first word line for the second normal MOS transistor arranged across the first active area;
a second word line for the first normal MOS transistor arranged across the second active area;
a third word line for the first reference MOS transistor arranged across the second active area, the third word line being spaced apart from the second word line by a predetermined distance;
a fourth word line for the second reference MOS transistor arranged across the third active area;
a first bit line contact plug and a first storage node contact plug for the second normal MOS transistor, the first bit line contact plug and the first storage node contact plug being laid out to be respectively connected to an upper portion and a lower portion of the first active area;
a second storage node contact plug for the first normal MOS transistor, the second storage node contact plug being laid out to be connected to an upper portion of the second active area;
a second bit line contact plug for the first normal MOS transistor and the first reference MOS transistor, the second bit line contact plug being laid out to be connected at a middle area of the second active area;
a third storage node contact plug for the first and second reference MOS transistors, the third storage node contact plug being laid out to be commonly connected to a lower portion of the second active area and an upper portion of the third active area;
a third bit line contact plug for the second reference MOS transistor, the third bit line contact plug being laid out to be connected to a lower portion of the third active area;
a second normal capacitor arranged at the first active area and connected to the first storage node contact plug;
a first normal capacitor arranged at the upper portion of the second active area and connected to the second storage node contact plug; the reference capacitor arranged at the lower portion of the second active area and connected to the third storage node contact plug;
the bit line intersected with the first to fourth word lines and connected to the second bit line contact plug; and
the bit line bar intersected with the first to fourth word lines and connected to the first and third bit line contact plugs.

18. The semiconductor memory device as recited in claim 17, wherein the first to fourth word lines are laid out with the same intervals.

19. The semiconductor memory device as recited in claim 18, further comprising a dummy capacitor arranged on the same layer as the reference capacitor at the upper portion of the third active area.

20. A semiconductor memory device having a folded bit line structure, composing:
a plurality of normal cells including a normal capacitor and a normal MOS transistor for connecting the normal capacitor to one of a bit line and a bit line bar;
a plurality of reference cells including a reference capacitor having a first node and a second node coupled to a reference voltage terminal, a first reference MOS transistor for connecting a corresponding bit line to a first node of the reference capacitor, and a second reference MOS transistor for connecting the first node of the reference capacitor to the bit line bar adjacent to the bit line;
a reference voltage supply unit for connecting the reference voltage terminal to the first node to charge the reference capacitor provided at each of the reference cells with a reference voltage during a precharge period;
at least two precharge MOS transistors for supplying the reference voltage to the reference capacitor provided in each of the reference cells during the precharge period; and
a metal shunt line for maintaining a drain of each of the precharge MOS transistors at the same voltage level.

21. The semiconductor memory device as recited in claim 20, wherein the reference capacitor provided at each of the reference cells is manufactured using the same process of manufacturing the normal capacitor provided at each of the normal cells.

22. The semiconductor memory device as recited in claim 21, wherein the reference capacitor provided at each of the reference cells is arranged as many as the capacitors corresponding to one word line arranged at the normal cell area, one capacitor selected between two adjacent capacitors being arranged as the reference capacitor, the other capacitor being arranged as a dummy capacitor.

23. The semiconductor memory device as recited in claim 20, further comprising:
- a precharge block for precharging the bit line and the bit line bar as a ground; and
- a sense amplifying block for sensing and amplifying the data by using a core voltage for operating the semiconductor memory device and a high voltage having a higher voltage level than the core voltage.

24. The semiconductor memory device as recited in claim 23, wherein the high voltage is inputted to the sense amplifying block during a predetermined period from a timing of starting to sense and amplify the data.

25. The semiconductor memory device as recited in claim 24, wherein the core voltage is inputted to the sense amplifying block after the predetermined period.

26. The semiconductor memory device as recited in claim 23, wherein the precharge block includes:
- a first MOS transistor for receiving a precharge signal and supplying the ground to the bit line as the precharge voltage in response to the precharge signal; and
- a second MOS transistor for receiving the precharge signal and supplying the ground to the bit line bar as the precharge voltage in response to the precharge signal.

27. The semiconductor memory device as recited in claim 23, wherein the sense amplifying block includes:
- a first p-type metal oxide semiconductor (PMOS) transistor having a gate, a drain and a source, the gate coupled to the bit line bar, the source for receiving one of the core voltage and the high voltage and the drain coupled to the bit line;
- a second PMOS transistor having a gate, a drain and a source, the gate coupled to the bit line, the source for receiving one of the core voltage and the high voltage and the drain coupled to the bit line bar;
- a first n-type metal oxide semiconductor (NMOS) transistor having a gate, a drain and a source, the gate coupled to the bit line bar, the source for receiving the ground and the drain coupled to the bit line; and
- a second NMOS transistor having a gate, a drain and a source, the gate coupled to the bit line, the source for receiving the ground and the drain coupled to the bit line bar.

28. The semiconductor memory device as recited in claim 23, further comprising a data output block for delivering the data amplified by the sense amplifying block into a data line and a data line bar or delivering an inputted data through the data line and the data line bar into the sense amplifying block.

29. The semiconductor memory device as recited in claim 28, wherein the data output block includes:
- a first MOS transistor coupled between the bit line and the data line for delivering a data loaded in the bit line into the data line; and
- a second MOS transistor coupled between the bit line bar and the data line bar for delivering a data loaded in the bit line bar into the data line bar.

30. The semiconductor memory device as recited in claim 23, further comprising an internal voltage generator for receiving a power supply voltage inputted to the semiconductor memory device to thereby generate the core voltage and the high voltage.

31. The semiconductor memory device as recited in claim 23, further composing:
- a connection block for connecting or disconnecting the normal cell block to the sense amplifying block in response to a connection signal.

32. The semiconductor memory device as recited in claim 31, wherein the connection signal based on inputted address and command is activated during a precharging operation.

* * * * *